US008629509B2

(12) United States Patent
Ryu et al.

(10) Patent No.: US 8,629,509 B2
(45) Date of Patent: Jan. 14, 2014

(54) HIGH VOLTAGE INSULATED GATE BIPOLAR TRANSISTORS WITH MINORITY CARRIER DIVERTER

(75) Inventors: Sei-Hyung Ryu, Cary, NC (US); Qingchun Zhang, Cary, NC (US)

(73) Assignee: Cree, Inc., Durham, NC (US)

( * ) Notice: Subject to any disclaimer, the term of this patent is extended or adjusted under 35 U.S.C. 154(b) by 418 days.

(21) Appl. No.: 12/556,870

(22) Filed: Sep. 10, 2009

(65) Prior Publication Data

US 2010/0301335 A1 Dec. 2, 2010

Related U.S. Application Data

(60) Provisional application No. 61/183,219, filed on Jun. 2, 2009.

(51) Int. Cl.
H01L 29/739 (2006.01)

(52) U.S. Cl.
USPC .................. 257/378; 257/197; 257/E29.197

(58) Field of Classification Search
CPC .............. H01L 29/063; H01L 29/0634; H01L 29/1608; H01L 29/165; H01L 29/7393; H01L 29/7395
USPC ........... 257/192, 197, 198, 373, 376, 378, 77, 257/262, E29.197
See application file for complete search history.

(56) References Cited

U.S. PATENT DOCUMENTS

| 3,439,189 | A | 4/1969 | Petry |
|---|---|---|---|
| 3,629,011 | A | 12/1971 | Tohi et al. |
| 3,924,024 | A | 12/1975 | Naber et al. |
| 4,160,920 | A | 7/1979 | Courier de Mere |
| 4,242,690 | A | 12/1980 | Temple |
| 4,466,172 | A | 8/1984 | Batra |
| 4,581,542 | A | 4/1986 | Steigerwald |
| 4,644,637 | A | 2/1987 | Temple |
| 4,811,065 | A | 3/1989 | Cogan |
| 4,875,083 | A | 10/1989 | Palmour |
| 4,927,772 | A | 5/1990 | Arthur et al. |
| 4,945,394 | A | 7/1990 | Palmour et al. |

(Continued)

FOREIGN PATENT DOCUMENTS

| DE | 39 42 640 A1 | 8/1990 |
|---|---|---|
| EP | 0 372 412 A1 | 6/1990 |

(Continued)

OTHER PUBLICATIONS

"Insulated-gate bipolar transistor." *Wikipedia, the Free Encyclopedia*. Web. Jun. 21, 2010. http://en.wikipedia.org.

(Continued)

*Primary Examiner* — Yu Chen
(74) *Attorney, Agent, or Firm* — Myers Bigel Sibley & Sajovec

(57) ABSTRACT

High power insulated gate bipolar junction transistors are provided that include a wide band gap semiconductor bipolar junction transistor ("BJT") and a wide band gap semiconductor MOSFET that is configured to provide a current to the base of the BJT. These devices further include a minority carrier diversion semiconductor layer on the base of the BJT and coupled to the emitter of the BJT, the minority carrier diversion semiconductor layer having a conductivity type opposite the conductivity type of the base of the BJT and forming a heterojunction with the base of the BJT.

25 Claims, 6 Drawing Sheets

(56) References Cited

U.S. PATENT DOCUMENTS

| | | |
|---|---|---|
| 4,946,547 A | 8/1990 | Palmour et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,124,772 A | 6/1992 | Hideshima et al. |
| 5,155,289 A | 10/1992 | Bowles |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,291,050 A * | 3/1994 | Nishimura .................. 257/340 |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,399,887 A | 3/1995 | Weitzel et al. |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,608,237 A | 3/1997 | Aizawa et al. |
| 5,623,151 A | 4/1997 | Ajit |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,169,300 B1 | 1/2001 | Fragapane |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schorner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,548,333 B2 | 4/2003 | Smith |
| 6,551,865 B2 | 4/2003 | Kumar et al. |
| 6,570,185 B1 | 5/2003 | Tan |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,183,575 B2 | 2/2007 | Shimoida et al. |
| 7,186,609 B2 | 3/2007 | Korec et al. |
| 7,221,010 B2 | 5/2007 | Ryu |
| 7,253,031 B2 | 8/2007 | Takahashi |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,781,786 B2 | 8/2010 | Hayashi et al. |
| 2001/0055852 A1 | 12/2001 | Moise et al. |
| 2002/0030191 A1 | 3/2002 | Das et al. |
| 2002/0038891 A1 | 4/2002 | Ryu et al. |

(56) References Cited

U.S. PATENT DOCUMENTS

| | | |
|---|---|---|
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0079989 A1 * | 4/2004 | Kaneko et al. ............... 257/328 |
| 2004/0082116 A1 | 4/2004 | Kub et al. |
| 2004/0183079 A1 | 9/2004 | Kaneko et al. |
| 2004/0211980 A1 | 10/2004 | Ryu |
| 2004/0212011 A1 | 10/2004 | Ryu |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0181536 A1 | 8/2005 | Tsuji |
| 2005/0245034 A1 | 11/2005 | Fukuda et al. |
| 2005/0275055 A1 | 12/2005 | Parthasarathy et al. |
| 2006/0011128 A1 | 1/2006 | Ellison et al. |
| 2006/0060884 A1 | 3/2006 | Ohyanagi et al. |
| 2006/0086997 A1 | 4/2006 | Kanaya et al. |
| 2006/0118818 A1 * | 6/2006 | Shimoida et al. ............ 257/183 |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2007/0066039 A1 | 3/2007 | Agarwal et al. |
| 2007/0120148 A1 | 5/2007 | Nogome |
| 2007/0164321 A1 | 7/2007 | Sheppard |
| 2007/0241427 A1 | 10/2007 | Mochizuki et al. |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0105949 A1 | 5/2008 | Zhang et al. |
| 2008/0191304 A1 | 8/2008 | Zhang et al. |
| 2008/0230787 A1 | 9/2008 | Suziki et al. |
| 2008/0251793 A1 | 10/2008 | Mazzola |
| 2008/0277669 A1 | 11/2008 | Okuno et al. |
| 2008/0296771 A1 | 12/2008 | Das et al. |
| 2009/0085064 A1 | 4/2009 | Rueb et al. |
| 2009/0121319 A1 | 5/2009 | Zhang et al. |
| 2009/0212301 A1 | 8/2009 | Zhang et al. |
| 2009/0289262 A1 | 11/2009 | Zhang et al. |
| 2010/0032685 A1 | 2/2010 | Zhang et al. |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0244047 A1 | 9/2010 | Hull et al. |

FOREIGN PATENT DOCUMENTS

| | | |
|---|---|---|
| EP | 0 615 292 A1 | 3/1994 |
| EP | 0 615 292 A1 | 9/1994 |
| EP | 0637069 A1 | 2/1995 |
| EP | 0735591 A1 | 10/1996 |
| EP | 0837508 A2 | 4/1998 |
| EP | 0 865 085 A1 | 9/1998 |
| EP | 1 058 317 A2 | 12/2000 |
| EP | 1 361 614 A1 | 11/2003 |
| EP | 1 460 681 A2 | 9/2004 |
| EP | 1 503 425 A2 | 2/2005 |
| EP | 1 693 896 A1 | 8/2006 |
| EP | 1 806 787 A1 | 7/2007 |
| EP | 1 845 561 A2 | 10/2007 |
| EP | 2 015 364 | 1/2009 |
| JP | 60-240158 | 11/1985 |
| JP | 01117363 | 5/1989 |
| JP | 03-016257 | 1/1991 |
| JP | 3 034466 A | 2/1991 |
| JP | 03034466 | 2/1991 |
| JP | 03157974 | 7/1991 |
| JP | 3-225870 | 10/1991 |
| JP | 03-259614 | 11/1991 |
| JP | 5 029628 A | 2/1993 |
| JP | 06-061496 | 3/1994 |
| JP | 08-051123 | 2/1996 |
| JP | 2006-511961 A | 4/1996 |
| JP | 08264766 | 10/1996 |
| JP | 9 129874 A | 5/1997 |
| JP | 09-139510 | 5/1997 |
| JP | 09205202 | 8/1997 |
| JP | 9 326486 A | 12/1997 |
| JP | 11191559 | 7/1999 |
| JP | 11238742 A | 8/1999 |
| JP | 11261061 A | 9/1999 |
| JP | 11266017 A | 9/1999 |
| JP | 11274487 | 10/1999 |
| JP | 2000049167 | 2/2000 |
| JP | 2000082812 A | 3/2000 |
| JP | 2000-252478 A | 9/2000 |
| JP | 02000252461 A | 9/2000 |
| JP | 2001-085704 A | 3/2001 |
| JP | 2000106371 A | 4/2001 |
| JP | 2002-314099 | 10/2002 |
| JP | 2005-167035 A | 6/2005 |
| JP | 2006-344779 | 12/2006 |
| JP | 2008-124426 A | 5/2008 |
| WO | WO 96/03774 | 2/1996 |
| WO | WO 97/08754 | 3/1997 |
| WO | WO 97/17730 | 5/1997 |
| WO | WO 97/39485 A1 | 10/1997 |
| WO | WO 98/02916 | 1/1998 |
| WO | WO 98/02924 A2 | 1/1998 |
| WO | WO 98/08259 | 2/1998 |
| WO | WO 98/32178 | 7/1998 |
| WO | WO 99/46809 | 9/1999 |
| WO | WO99/63591 A1 | 12/1999 |
| WO | WO 00/13236 A3 | 3/2000 |
| WO | WO 01/78134 A1 | 10/2001 |
| WO | WO 2004/020706 A1 | 3/2004 |
| WO | WO 2004/079789 A2 | 9/2004 |
| WO | WO 2005/020308 A1 | 3/2005 |
| WO | WO 2006/135031 A2 | 12/2006 |
| WO | WO 2007/040710 A1 | 4/2007 |

OTHER PUBLICATIONS

A.K. Agarwal, J.B. Casady, L.B. Rowland, W.F. Valek, and C.D. Brandt, "1400 V 4H-SiC Power MOSFET's," *Materials Science Forum* vols. 264-268, pp. 989-992, 1998.

A.K. Agarwal, J.B. Casady, L.B. Rowland, W.F. Valek, M.H. White, and C.D. Brandt, "1.1 kV 4H-SiC Power UMOSFET's," *IEEE Electron Device Letters*, vol. 18, No. 12, pp. 586-588, Dec. 1997.

A.K. Agarwal, N.S. Saks, S.S. Mani, V.S. Hegde and P.A. Sanger, "Investigation of Lateral RESURF, 6H-SiC MOSFETs," *Materials Science Forum*, vols. 338-342, pp. 1307-1310, 2000.

A.K. Agarwal, S. Seshadri, and L.B. Rowland, "Temperature Dependence of FowlerNordheim Current in 6H- and 4H-SiC MOS Capacitors," *IEEE Electron Device Letters*, vol. 18, No. 12, Dec. 1997, pp. 592-594.

A.V. Suvorov, L.A. Lipkin, G.M. Johnson, R. Singh and J.W. Palmour, "4H-SiC Self-Aligned Implant-Diffused Structure for Power DMOSFETs," *Materials Science Forum* vols. 338-342, pp. 1275-1278, 2000.

Agarwal et al. "A Critical Look at the Performance Advantages and Limitations of 4H-SiC Power UMOSFET Structures," *1996 IEEE ISPSD and IC's Proc.*, May 20-23, 1996, pp. 119-122.

Asano et al., "Dynamic Characteristics of 6.2kV High Voltage 4H-SiC pn Diode with Low Loss", Transactions of the Institute of Electrical Engineers of Japan, Part D Inst. Electr. Eng. Japan, vol. 123D, No. 5, May 2003, pp. 623-627, XP8124184.

(56) References Cited

OTHER PUBLICATIONS

Ayalew, T, "Dissertation of Tesfaye Ayalew", Section 4.4.3.1 MPS Diode Structure, *SiC Semiconductor Devices Technology, Modeling, and Simulation*, 2006.

Baliga "Insulated Gate Biopolar Transistor" *Power Semiconductor Devices*. PES Publishing Company, Boston, MA. 426-502 (1996).

Baliga "Power MOSFET" *Power Semiconductor Devices*. PWS Publishing Company, Boston, MA 335-425 (1996).

Bhatnagar et al. "Comparison of 6H-SiC, 3C-SiC, and Si for Power Devices," *IEEE Transactions on Electron Devices*, vol. 40, No. 3, Mar. 1993, pp. 645-655.

Capano, M.A., et al., Ionization Energies and Electron Mobilities in Phosphorus—and Nitrogen-Implanted 4H-Silicon Carbide, IEEE ICSCRM Conference 1999, Research Triangle Park, North Carolina (Oct. 10-13, 1999).

Chakraborty et al. "Interface Properties of $N_2O$-annealed $SiO_2/SiC$ system," *Proceedings IEEE Hong Kong Electron Devices Meeting*. Jun. 24, 2000, pp. 108-111.

Chang et al. "Observation of a Non-stoichiometric Layer at the Silicon Dioxide—Silicon Carbide Interface: Effect of Oxidation Temperature and Post-Oxidation Processing Conditions," *Mat. Res. Soc. Symp. Proc*. vol. 640, 2001.

Chen et al. "Theoretical Analysis of Current Crowding Effect in Metal/AlGaN/GaN Schottky Diodes and Its Reduction by Using Polysilicon in Anode, " *Chin. Phys. Lett*., vol. 24, No. 7 (2007) pp. 2112-2114.

Chinese Office Action dated Jan. 22, 2010, corresponding to Chinese Patent Application No. 200780029460.5, 7 pages.

Cho et al. "Improvement of charge trapping by hydrogen post-oxidation annealing in gate oxide of 4H-SiC methel-oxide-semiconductor capacitors," *Applied Physics Letters*. vol. 77, No. 8, pp. 1215-1217 (Aug. 21, 2000).

Chung et al. "Effects of anneals in ammonia on the interface trap density near athe band edges in 4H-silicon carbide metal-oxide-semiconductor capacitors," *Applied Physics Letters*. vol. 77, Nov. 27, 2000, pp. 3601-3603.

Chung at al., "The Effect of Si:C Source Ratio on $SiO_2/SiC$ Interface State Density for Nitrogen Doped 4H and 6H-SiC," *Materials Science Forum*. (2000) vols. 338-342, pp. 1097-1100.

International Search Report and Written Opinion for corresponding International Application No. PCT/US2004/004982, dated Jul. 22, 2004.

International Search Report for PCT/US01/42414, dated Apr. 23, 2002.

International Search Report for PCT/US02/11691 dated Dec. 4, 2002.

D. Alok, E. Arnold, and R. Egloff, "Process Dependence of Inversion Layer Mobility in 4H-SiC Devices," *Materials Science Forum*, vols. 338-342, pp. 1077-1080, 2000.

Dahlquist et al. "A 2.8kV, Forward Drop JBS Diode with Low Leakage," *Materials Science Forum*, vols. 338-342, (2000) pp. 1179-1182.

Das, Mrinal K. Graduate thesis entitled, *Fundamental Studies of the Silicon Carbide MOS Structure*. Purdue University, 1999.

Dastidar, Sujoyita, A Study of P-Type Activation in Silicon Carbide, Thesis (Purdue University, May 1998).

De Meo et al., "Thermal Oxidation of SiC in $N_2O$", *J. Electrochem. Soc*., vol. 141, 1994, pp. L150-L152.

del Prado et al. "Full Composition Range Silicon Oxynitride Films Deposited by CR-PECVD at Room Temperatures," *Thin Solid Films*. vol. 343-344 (1999) p. 437-440.

Dimitrijev et al., "Nitridation of Silicon-Dioxide Films Grown on 6H Silicon Carbide", *IEEE Electronic Device Letters*, vol. 18, No. 5, May 5, 1997, pp. 175-177.

European Search Report for corresponding EP patent application No. 09177558.5 dated Feb. 22, 2010.

European Search Report for corresponding EP patent application No. 09163424.6 dated Apr. 9, 2010.

European Search Report; Application No. EP07120038; Jun. 16, 2008.

Extended European Search Report (12 pages) corresponding to European Application No. 07112298; Dated Feb. 18, 2009.

Fisher, C.A. et al., "The performance of high-voltage field relieved Schottky barrier diodes", IEe Proceedings, vol. 132:6, Pt. I, pp. 257-260 (Dec. 1985).

Fukuda et al. "Improvement of $SiO_2$/4H-Sic Interface Using High-Temperature Hydrogen Annealing at Low Pressure and Vacuum Annealing," *Jpn J. Appl. Phys*. vol. 38, Apr. 1999, pp. 2306-2309.

Fukuda et al. "Improvement of $SiO_2$/4H-SiC Interface by Using High Temperature Hydrogen Annealing at 1000° C.," *Extended Abstracts of the International Conference on Solid State Devices and Materials*. Japan Society of Applied Physics, Tokyo, Japan, Sep. 1998.

G.Y. Chung, C.C. Tin, J.R. Williams, K. McDonald, M. Di Ventra, S.T. Pantelides, L.C. Feldman, and R.A. Weller, "Effect of nitric oxide annealing on the interface trap densities near the band edges in the 4H polytype of silicon carbide," *Applied Physics Letters*, vol. 76, No. 13, pp. 1713-1715, Mar. 2000.

G.Y. Chung, C.C. Tin, J.R. Williams, K. McDonald, R.K. Chanana, R.A. Weller, S.T. Pantelides, L.C. Feldman, O.W. Holland, M.K. Das, and J.W. Palmour, "Improved Inversion Channel Mobility for 4H-SiC MOSETs Following High Temperature Anneals in Nitric Oxide," *IEEE Electron Device Letters*, vol. 22, No. 4, Apr. 2001.

H.F. Li, S. Dimitrijev, H.B. Harrison, D. Sweatman, P.T. Tanner. "Improving $SiO_2$ Grown on P-Type 4H-SiC by NO Annealing," *Materials Science Forum*. vols. 264-268 (1998) pp. 869-872.

http://www.elec.gla.ac.uk; *The Insulated Gate Bipolar Transistor (IGBT)*; Feb. 14, 2007.

Hubei, K, "Hybrid design improves diode robustness and boosts efficiency," Compoundsemiconductor.net, 2006.

Hull et al., "Drift-Free 10-kV, 20-A 4H-SiC PiN Diodes," Journal of Electronic Materials, vol. 34, No. 4, 2005, pp. 341-344.

International Preliminary Report on Patentability (9 pages) corresponding to International Application No. PCT/US2007/010192; Mailing Date: Sep. 23, 2008.

International Search Report and Written Opinion (13 pages) corresponding to International Application No. PCT/US2008/010538; Mailing Date: Dec. 22, 2008.

International Search Report and Written Opinion (14 pages) corresponding to International Application No. PCT/US2010/020071; Mailing Date: Mar. 26, 2010.

International Search Report and Written Opinion (14 pages) corresponding to International Application No. PCT/US2009/065251; Mailing Date: Jun. 1, 2010.

International Search Report and Written Opinion (16 pages) corresponding to International Application No. PCT/US2009/003089; Mailing Date: Aug. 20, 2009.

International Search Report and Written Opinion for PCT/US2007/014139; Feb. 4, 2008.

International Search Report and Written Opinion for PCT/US2010/025053 mailed on Jul. 2, 2010.

International Search Report and Written Opinion, International Application No. PCT/US2009/000734, Apr. 23, 2009.

International Search Report, PCT/US2008/008574, Sep. 26, 2008.

Invitation to Pay Additional Fees for PCT/US2007/010192; Oct. 29, 2007.

Invitation to Pay Additional Fees for PCT/US2010/025053 mailed on May 3, 2010.

J. Tan, J.A. Cooper, Jr., and Mr. R. Melloch, "High-Voltage Accumulation-Layer UMOSFETs in 4H-SiC," *IEEE Electron Device Letters*, vol. 19, No. 12, pp. 487-489, Dec. 1998.

J.B. Casady, a.K. Agarwal, L.B. Rowland, W.F. Valek, and C.D. Brandt, "900 V DMOS and 1100 V UMOS 4H-SiC Power FETs," *IEEE Device Research Conference*, Ft. Collins, CO Jun. 23-25, 1997.

J.N. Shenoy, J.A. Cooper and M.R. Meelock, "High-Voltage Double-Implanted Power MOSFETs in 6H-SiC," *IEEE Electron Device Letters*, vol. 18, No. 3, pp. 93-95, Mar. 1997.

Jamet, et al. "Physical properties of $N_2O$ and NO-nitrided gate oxides grown on 4H SiC," *Applied Physics Letters*. vol. 79, No. 3, Jul. 16, 2001, pp. 323-325.

K. Ueno and Tadaaki Oikawa, "Counter-Doped MOSFET's of 4H-SiC," *IEEE Electron Device Letters*, vol. 20, No. 12, pp. 624-626, Dec. 1999.

(56) References Cited

OTHER PUBLICATIONS

K. Ueno, R. Asai, and T. Tsuji. "4H-SiC MOSFET's Utilizing the H2 Surface Cleaning Technique." *IEEE Electron Device Letters*, vol. 19, No. 7, Jul. 1998, pp. 244-246.

Katsunori Ueno, Tatsue Urushidani, Kouicki Hahimoto, and Yasukazu Seki. "The Guard-Ring Termination for the High-Voltage SiC Schottky Barrier Diodes". *IEEE Electron Device Letters*. vol. 16. No. 7, Jul. 1995, pp. 331-332.

Kinoshita et al., "Guard Ring Assisted RESURF: A New Termination Structure Providing Stable and High Breakdown Voltage for SiC Power Devices, " Tech. Digest of ISPSD '02, pp. 253-256.

Kobayashi et al. "Dielectric Breakdown and Current Conduction of Oxide/Nitride/Oxide Multi-Layer Structures," *1990 IEEE Symposium on VLSI Technology*. pp. 119-120.

Krishnaswami et al., "High Temperature characterization of 4H-SiC bipolar junction transistors", Materials Science Forum, Aedermannsfdorf, CH, vol. 527-529, Jan. 1, 2006, pp. 1437-1440, XP009138720, ISSN: 0255-5476.

L.A. Lipkin and J.W. Palmour, "Low interface state density oxides on p-type SiC," Materials Science Forum vols. 264-268, pp. 853-856, 1998.

Lai et al., "Interface Properties of $N_2O$-Annealed $NH_3$-Treated 6H-SiC MOS Capacitor," *Proc. 1999 IEEE Hong Kong Electron Devices Meeting*, Jun. 26, 1999, pp. 46-49.

Leonhard et al. "Long term stability of gate-oxides on n- and p-type silicon carbide studied by charge injection techniques," *Materials Science Engineering*, vol. 46, No. 1-3, Apr. 1997, pp. 263-266.

Levinshtein et al., "On the homogeneity of the turn-on process in high voltage 4H-SiC thyristors", *Solid-State Electronics*, vol. 49, No. 2, Feb. 1, 2005, pp. 233-237, XP004645018 Elsevier Science Publishers, Barking (GB) ISSN: 0038-1101.

Lipkin et al. "Insulator Investigation on SiC for Improved Reliability," *IEEE Transactions on Electron Devices*. vol. 46, No. 3, Mar. 1999, pp. 525-532.

Lipkin et al. "Challenges and State-of-the-Art Oxides in SiC," *Mat. Res. Soc. Symp. Proc.* vol. 640, 2001, pp. 27-29.

Losee et al., "Degraded Blocking Performance of 4H-SiC Rectifiers Under High dV/dt Conditions", Proceedings of 17$^{th}$ International Symposium on Power Semiconductor Devices & IC'S, 4 pages (May 23-26, 2005). XP010820730.

Losee et al., "High-Voltage 4H-SiC PiN Rectifiers with Single-Implant, Multi-Zone JTE Termination", Power Semiconductor Devices and ICs, 2004 Proceedings. ISPSB '04. The 16$^{th}$ International Symposium on Kitakyushu Int. Conf. Center, Japan May 24-27, 2004, Piscataway, NJ, USA, IEEE, May 24, 2004, pp. 301-304, XP010723398.

M. Das et al., "A 13 kV 4H-SiC N-Channel IGBT with Low Rdiff, on and Fast Switching" presented at: International Conference on Silicon Carbide and Related Materials )Icscrm), Otsu, Japan, Oct. 14-19, 2007.

M. K. Das, L.A. Lipkin, J.W. Palmour, G.Y. Chung, J.R. Williams, K. McDonald, and L.C. Feldman, "High Mobility 4H-SiC Inversion Mode MOSFETs Using Thermally Grown, NO Annealed $SiO_2$," *IEEE Device Research Conference*, Denver, CO Jun. 19-21, 2000.

M.A. Capano, S. Ryu, J.A. Cooper, Jr., M.R. Melloch, K. Rottner, S. Karlsson, N. Nordell, A. Powell, and D.E. Walker, Jr., "Surface Roughening in Ion Implanted 4H-Silicon Carbide," *Journal of Electronic Materials*, vol. 28, No. 3, pp. 214-218, Mar. 1999.

M.K. Das, J.A. Cooper, Jr., M.R. Melloch, and M.A. Capano, "Inversion Channel Mobility in 4H- and 6H-SiC MOSFETs," *IEEE Semiconductor Interface Specialists Conference*, San Diego, CA, Dec. 3-5, 1998.

Ma et al. "Fixed and trapped charges at oxide-nitride-oxide heterostructure interfaces formed by remote plasma enhanced chemical vapor deposition," *J. Vac. Sci. Technol. B*. vol. 11, No. 4, Jul./Aug. 1993, pp. 1533-1540.

Mondal et al. "An Integrated 500-V Power DSMOSFET/Antiparallel Rectifier Device with Improved Diode Reverse Recovery Characteristics," *IEEE Electron Device Letters*, vol. 23, No. 9, Sep. 2002, pp. 562-564.

Motorola Power MOSFET Transistor Databook, 4th edition. Motorola, INc., 1989, pp. 2-5-4-2-5-7.

Mutin, P. Herbert, "Control of the Composition and Structure of Silicon Oxycarbide and Oxynitride Glasses Derived from Polysiloxane Precursors," *Journal of Sol-Gel Science and Technology*. vol. 14 (1999) pp. 27-38.

Myer-Ward et al. "Turning of Basal Plane Dislocations During Epitaxial Growth on 4 off-axis 4h-SiC" 7$^{th}$ *European Conference on Silicon Carbide and Related Materials*, Barcelona-Spain, Sep. 7-11, 2008 retrieved from http://ecscrm08.com/invited_presentations. html , retrieved Jul. 1, 2009.

Notification of Transmittal of the International Search Report and the Written Opinion of the International Searching Authority, or the Declaration, International Search Report, Written Opinion of the International Searching Authority, PCT/US2010/026632, Date of Mailing: Oct. 8, 2010, 16 pages.

Notification of Transmittal of the International Search Report and the Written Opinion of the International Searching Authority, or the Declaration, International Search Report, Written Opinion of the International Searching Authority, PCT/US2010/035713, Date of Mailing: Jul. 27, 2010, 14 pages.

Notification of Transmittal of the International Search Report and the Written Opinion of the International Searching Authority, or the Declaration, International Search Report, Written Opinion of the International Searching Authority, PCT/US2010/042075, Date of Mailing: Sep. 24, 2010, 15 pages.

Notification of Transmittal of the International Search Report and the Written Opinion of the International Searching Authority, or the Declaration, PCT/US2010/028612, Jun. 17, 2010.

Notification of Transmittal of the International Search Report and the Written Opinion of the International Searching Authority, or the Declaration; International Search Report; Written Opinion of the International Searching Authority, PCT/US2008/004239, Mar. 2, 2009.

P.J. Tobin, Y. Okada, S. A. Ajuria, V. Lakhotia, W.A. Feil, and R. I. Hedge, "Furnace formation of silicon oxynitride thin dielectrics in nitrous oxide ($N_2O$): The role of nitric oxide (NO)." *Journal of Applied Physics*. vol. 75, No. 3, Feb. 1, 1994, pp. 1811-1817.

P.M. Shenoy and B.J. Baliga, "The Planar 6H-SiC ACCUFET: A New High-Voltage Power Mosfet Structure," *IEEE Electron Device Letters*, vol. 18, No. 12, pp. 589-591, Dec. 1997.

Palmour et al. "SiC Device Technology: Remaining Issues," Diamond and Related Materials. vol. 6, 1997, pp. 1400-1404.

Palmour J: "Silicon Carbide npnp Thyristors", NASA Technical Briefs—Electronics and Computers, Dec. 1, 2000, John H. Glenn Research Center, Cleveland, Ohio (US); XP-002567723, http://www.techbriefs.com/component/content/article/7031-lew-16750?tmpl=component&print=1&page= retrieved on Feb. 10, 2010).

Panknin et al., "Electrical and microstructurel properties of highly boron-implantation doped 6H-SiC", Journal of Applied Physics 89:6, pp. 3162-3167 (Mar. 15, 2001).

Pantelides et al., "Atomic-Scale Engineering of the SiC—SiO2 Interface," *Materials Science Forum*. (2000) vols. 338-342, pp. 1133-1136.

Q. Zhang et al. "12 kV 4H-SiC p-IGBTs with Record Low Specific On-Resistance" presented at: International Conference on Silicon Carbide and Related Materials (ICSRM), Otsu, Japan, Oct. 14-19, 2007.

R. Schörner, P. Friedrichs, D. Peters, and D. Stephani, "Significantly Improved Performance of MOSFETs on Silicon Carbide Using the 15R-SiC Polytype," *IEEE Electron Device Letters*, vol. 20, No. 5, pp. 241-244, May 1999.

R. Schörner, P. Friedrichs, D. Peters, H. Mitlehner, B. Weis, and D. Stephani, "Rugged Power MOSFETs in 6H-SiC with Blocking Capability up to 1800 V," *Materials Science Forum* vols. 338-342, pp. 1295-1298, 2000.

Ranbir Singh, Sei-Hyung Ryu and John W. Palmour, "High Temperature, High Current, 4H-SiC Accu-DMOSFET," Materials Science Forum vols. 338-342, pp. 1271-1274, 2000.

Rao et al. "Al and N Ion Implantations in 6H-SiC," Silicon Carbide and Related Materials. 1995 Conf, Kyoto, Japan. Published 1996.

(56) References Cited

OTHER PUBLICATIONS

Rao et al. "P-N Junction Formation in 6H-SiC by Acceptor Implantation into N-Type Substrate," Nuclear Instruments and Methods in Physics Research B. vol. 106, 1995, pp. 333-338.
Rao et al. "Silane overpressure post-implant annealing of Al dopants in SiC: Cold wall CVD apparatus" *Applied Surface Science* 252: 3837-3842 (2006).
Rao, "Maturing ion-implantation technology and its device applications in SiC", *Solid State Electronics* 47:2, pp. 213-222, Elsevier Science Publishers (Feb. 2003).
S. Sridevan and B. Jayant Baliga, "Lateral N-Channel Inversion Mode 4H-SiC Mosfet's," *IEEE Electron Device Letters*, vol. 19, No. 7, pp. 228-230, Jul. 1998.
S. Sridevan, P.K. McLarty, and B.J. Baliga, "On the Presence of Aluminum in Thermally Grown Oxides on 6H-Silicon Carbide," *IEEE Electron Device Letters*, vol. 17, No. 3, pp. 136-138, Mar. 1996.
S.M. Sze Semiconductor Devices, Physics and Technology. $2^{nd}$ Edition, © 2002 John Wiley and Sons, p. 130.
S.T. Pantelides, "Atomic Scale Engineering of SiC Dielectric Interfaces," DARPA/MTO High Power and ONR Power Switching MURI Reviews, Rosslyn, VA, Aug. 10-12, 1999.
Senzaki et al.; *Effects of Pyrogenic Reoxidation Annealing on Inversion Channel Mobility of 4H-SiC Metal-Oxide-Semiconductor Field-Effect Transistor Fabricated on (1120) Face*; Japanese Journal of Applied Physics, Japan Society of Applied Physics, Tokyo, JP; vol. 40, No. 11B, Part 2; Nov. 2001; pp. L1201-L1203.
Singh, R. and J.W. Palmour, "Planer Terminations in 4H-SiC Schottky Diodes with Low Leakage and High Yields," IEEE International Symposium on Power Semiconductor Devices and ICs, 1997, pp. 157-160.
Stengl et al., "Variation of Lateral Doping—A New Concept to Avoid High Voltage Breakdown of Planar Junctions", International Electron Devices Meeting; Washington, Dec. 1-4, 1985; pp. 154-157, XP002013050.
Stengl et al., Variation of Lateral Doping as a Field Terminator for High-Voltage Power Devices, IEEE Transactions on Electron Devices; vol. ED-33, No. 3, Mar. 1986, pp. 426-428, XP000836911.
Streetman "Bipolar Junction Transistors" *Solid State Electronic Devices*. Prentice Hall,.Englewood Cliffs, NJ. 228-284 (1980).
Sugawara et al., "3.6 kV 4H-SiC JBS Diodes with Low RonS". Materials Science Forum, vols. 338-342:2, pp. 1183-1186 (2000). XP-000944901.
Sundaresan et al., "Ultra-low resistivity Al+ implanted 4H-SiC obtained by microwave annealing and a protective graphite cap", *Solid-State Electronics* vol. 52, 2008, pp. 140-145, XP022360431.
Suzuki et al. "Effect of Post-oxidation-annealing in Hydrogen on $SiO_2$/4H-SiC Interface," *Materials Science Forum*, vols. 338-342 (2000) 1073-6.
Sze, S.M. *Physics of Semiconductor Devices*, John Wiley & Sons, p. 383-390, 1981.
Thomas et al., "Annealing of Ion Implantation Damage in SiC Using a Graphite Mask", Material Research Society Symposium Y Proceedings vol. 572, Spring 1999, pp. 45-50.
V.R. Vathulya, H. Shang, and M.H. White, "A Novel 6H-SiC Power DMOSFET with Implanted P-Well Spacer," *IEEE Electronic Device Letters*, vol. 20, No. 7, Jul. 1999, pp. 354-356.
V.V. Afanasev, M. Bassler, G. Pensl, and M. Schulz, "Intrinsic SiC/$SiO_2$ Interface States," *Phy. Stat. Sol. (a)*, vol. 162, pp. 321-337, 1997.
Vassilevski et al., "High Voltage Silicon Carbide Schottky Diodes with Single Zone Junction Termination Extension", Materials Science Forum, 2007 Trans Tech Publications, vols. 556-557 (2007) pp. 873-876, XP8124186.
Vassilevski et al., "Protection of selectively implanted and patterned silicon carbide surfaces with graphite capping layer during post-implantation annealing," Institute of Physics Publishing, Semicond. Sci. Technol. 20 (2005) 271-278.

Wang et al. "High Temperature Characteristics of High-Quality SiC MIS Capacitors with O/N/O Gate Dielectric," *IEEE Transactions on Electron Devices*. vol. 47, No. 2, Feb. 2000, pp. 458-462.
Williams et al. "Passivation of the 4H-SiC/$SiO_2$ Interface with Nitric Oxide," *Materials Science Forum*. vols. 389-393 (2002), pp. 967-972.
Xu et al. "Improved Performance and Reliability of $N_2O$-Grown Oxynitride on 6H-SiH," *IEEE Electron Device Letters*. vol. 21, No. 6, Jun. 2000, p. 298-300.
Y. Li et al., "High Voltage (3 kV) UMOSFETs in 4H-SiC," *Transactions on Electron Devices*, vol. 49, No. 6, Jun. 2002.
Zhang et al.; *Design and Fabrications of High Voltage IGBTs on 4H-SiC*; 2006 IEEE Proceedings of the $18^{th}$ International Symposium on Power Semiconductor Devices & ICs, Napels, Italy Jun. 4-8, 2006, pp. 1-4.
International Search Report and Written Opinion of the International Searching Authority corresponding to International Application No. PCT/US2010/035709; Date of Mailing: Apr. 7, 2011; 12 pages.
Q. Zhang et al. "12 kV 4H-SiC p-IGBTs with Record Low Specific On-Resistance" presented at: International Conference on Silicon Carbide and Related Materials (ICSCRM), Otsu, Japan, Oct. 14-19, 2007.
M. Das et al., "A 13 kV 4H-SiC N-Channel IGBT with Low Rdiff,on and Fast Switching" presented at: International Conference on Silicon Carbide and Related Materials (ICSCRM), Otsu, Japan, Oct. 14-19, 2007.
European Office Action Corresponding to European Application No. 07 112 298.0; Dated: Jan. 16, 2012; 7 pages.
International Preliminary Report on Patentability Corresponding to International Application No. PCT/US2010/034502; Date of Mailing: Jan. 26,2012; 12 pages.
Ryu et al. "10 kV, 123 m$\Omega$-cm<2>4H-SiC Power DMOSFETs" *Device Research Conference, 2004. $62^{nd}$ DRC. Conference Digest*, Jun. 21-23, 2004, Piscataway, NJ, USA, IEEE, Jun. 21, 2004, pp. 47-48.
Tang et al. "High-Voltage Implanted-Emitter 4H-SiC BJTS" *IEEE Electron Device Letters*, IEEE Service Center, New York, NY. vol. 23 No. 1. Jan. 1, 2002.
Tang et al. "Hybrid All-Sic MOS-Gated Bipolar Transistor (MGT)" *Proceedings of the $14^{th}$ International Symposium on Power Semiconductor Devices & ICS. ISPSD'02*. Santa Fe, NM Jun. 4-7, 2002; International Symposium on Power Semiconductor Devices & IC's, New York, NY: IEEE, Jun. 4, 2002, pp. 53-56.
Zhang et al., "A 10-kV Monolithic Darlington Transistor with $\beta$forced of 336 in 4H-SiC," *IEEE Electron Device Letters*, vol. 30, No. 2, Feb. 1, 2009, pp. 142-144.
International Preliminary Report on Patentability Corresponding to PCT/US2010/035709; Date of Mailing: Dec. 15, 2011; 8 pages.
International Preliminary Report on Patentability Corresponding to PCT/US2010/035713; Date of Mailing: Dec. 15, 2011; 8 pages.
International Preliminary Report on Patentability Corresponding to International Application No. PCT/US2011/027383; Date of Mailing: Sep. 20, 2012; 7 Pages.
Notification Concerning Transmittal of International Preliminary Report on Patentability corresponding to International Application No. PCT/US2011/031150; Date of Mailing: Oct. 26, 2012; 8 Pages.
European Examination Report Corresponding to European Application No. 07 120 038; Dated: Apr. 15, 2013; 5 Pages.
Torvik et al., Electrical characterization of GaN/SiC n-p heterojunction diodes, *Appl. Phys. Lett.* 72, (1998), pp. 1371-1373.
Japanese Office Action Corresponding to Japanese Patent Application No. 2012-513972: Dated: Aug. 14, 2013; Foreign Text, 4 Pages, English Translation Thereof, 4 Pages.
Japanese Office Action Corresponding to Japanese Patent Application No. 2012-513972; Dated: Aug. 14 , 2013; Foreign Text, 3 Pages, English Translation Thereof, 3 Pages.

* cited by examiner

HIGH VOLTAGE INSULATED GATE BIPOLAR TRANSISTORS WITH MINORITY CARRIER DIVERTER

CROSS-REFERENCE TO RELATED APPLICATION

The present application claims priority under 35 U.S.C. §119(e) to U.S. Provisional Patent Application Ser. No. 61/183,219, filed Jun. 2, 2009, the content of which is incorporated herein by reference as if set forth in its entirety.

FIELD OF THE INVENTION

The present invention relates to semiconductor devices and, more particularly, to high voltage insulated gate bipolar junction transistors.

BACKGROUND

Circuits in motor drives, appliance controls, robotics, lighting ballasts and other applications often require semiconductor switching devices that can carry large currents and support high blocking voltages. The bipolar junction transistor ("BJT") has been the switching device of choice for many high power applications because of its ability to handle relatively large output currents and support relatively high blocking voltages.

As is well known to those of skill in the art, a BJT is a three-terminal device constructed of a doped semiconductor material. A BJT includes two p-n junctions that are formed in close proximity to each other in the semiconductor material. In operation, charge carriers enter a first region of the semiconductor material (which is called the emitter) that is adjacent one of the p-n junctions. Most of the charge carriers exit the device from a second region of the semiconductor material (which is called the collector) that is adjacent the other p-n junction. The collector and emitter are formed in regions of the semiconductor material that have the same conductivity type. A third region of the semiconductor material, known as the base, is positioned between the collector and the emitter and has a conductivity type that is opposite the conductivity type of the collector and the emitter. Thus, the two p-n junctions of the BJT are formed where the collector meets the base and where the base meets the emitter. By flowing a small current through the base of a BJT, a proportionally larger current passes from the emitter to the collector.

A BJT may be a "PNP" device or an "NPN" device. In a PNP BJT, the emitter and collector are formed in p-type regions of the semiconductor material, and the base is formed in an n-type region of the semiconductor that is interposed between the two p-type regions. In an NPN BJT, the emitter and collector are formed in n-type regions of the semiconductor material, and the base is formed in a p-type region of the semiconductor that is interposed between the two n-type regions.

BJTs are current controlled devices in that a BJT is turned "on" (i.e., it is biased so that current flows from the emitter to the collector) by flowing a current through the base of the transistor. For example, in an NPN BJT, the transistor is typically turned on by applying a positive voltage to the base to forward bias the base-emitter p-n junction. When the device is biased in this manner, holes flow into the base of the transistor where they are injected into the emitter. The holes are referred to as "majority carriers" because the base is a p-type region, and holes are the "normal" charge carriers in such a region. At the same time, electrons are injected from the emitter into the base, where they diffuse toward the collector. These electrons are referred to as "minority carriers" because electrons are not the normal charge carrier in the p-type base region.

The base of the device is formed to be a relatively thin region in order to minimize the percentage of the minority carriers (i.e., the electrons injected into the base from the emitter in an NPN BJT) that recombine with the majority carriers that flow between the base and the emitter. The collector-base p-n junction is reverse biased by applying a positive voltage to the collector. This facilitates sweeping the electrons that are injected from the emitter into the base to the collector. The device is referred to as a "bipolar" device because the emitter-collector current includes both electron and hole current. The majority current that flows through the base of the device controls the emitter-collector current.

A BJT may require a relatively large base current (e.g., one fifth to one tenth of the collector current) to maintain the device in its "on" state. As high power BJTs have large collector currents, they also typically have significant base current demands. Relatively complex external drive circuits may be required to supply the relatively large base currents that can be required by high power BJTs. These drive circuits are used to selectively provide a current to the base of the BJT that switches the transistor between its "on" and "off" states.

Power Metal Oxide Semiconductor Field Effect Transistors ("MOSFET") are another well known type of semiconductor transistor that may be used as a switching device in high power applications. A power MOSFET may be turned on or off by applying a gate bias voltage to a gate electrode of the device. For example, an n-type MOSFET turns on when a conductive n-type inversion layer is formed in a p-type channel region of the device in response to the application of a positive bias to the gate electrode. This inversion layer electrically connects the n-type source and drain regions of the MOSFET, thereby allowing for majority carrier conduction therebetween.

The gate electrode of a power MOSFET is separated from the channel region by a thin insulating layer. Because the gate of the MOSFET is insulated from the channel region, minimal gate current is required to maintain the MOSFET in a conductive state or to switch the MOSFET between its on and off states. The gate current is kept small during switching because the gate forms a capacitor with the channel region. Thus, only minimal charging and discharging current ("displacement current") is required during switching, allowing for less complex gate drive circuitry. Moreover, because current conduction in the MOSFET occurs solely through majority carrier transport, the delay associated with the recombination of excess minority carriers that occurs in BJTs is not present in MOSFET devices, allowing for switching speeds that can be orders of magnitude faster than that of BJTs. The drift region of a power MOSFET, however, may exhibit a relatively high on-resistance, which arises from the absence of minority carrier injection. As a result, the operating forward current density of a power MOSFET is typically limited to relatively low values as compared to power BJTs.

Devices embodying a combination of bipolar current conduction with MOS-controlled current flow are also known. One example of such a device is the Insulated Gate Bipolar Transistor ("IGBT"), which is a device that combines the high impedance gate of the power MOSFET with the small on-state conduction losses of the power BJT. An IGBT may be implemented, for example, as a Darlington pair that includes a discrete high voltage n-channel MOSFET at the input and a discrete BJT at the output. The MOSFET supplies the base current of the BJT while presenting minimal load to external drive circuits. The IGBT may combine the high temperature, high current density switching characteristics of the BJT with the minimal drive requirement of the MOSFET.

FIG. 1 is a simplified circuit diagram of a conventional n-channel IGBT 5. As shown in FIG. 1, the IGBT 5 includes a PNP BJT 10 and a MOSFET 20 that are configured as a Darlington pair so that the MOSFET channel current drives the base 12 of the BJT 10. The n$^-$-type drift region of the device exhibits a resistance 13. Application of a threshold voltage to the gate 22 of the MOSFET 20 causes a current to flow through the channel 18 of the MOSFET 20 that drives the gate 12 of the BJT 10, thereby turning on the BJT 10.

FIG. 2 is a more complete equivalent circuit of the IGBT 5 of FIG. 1 that illustrates a parasitic NPN transistor 30 that is formed by the n$^+$-type MOSFET source 24, the p-type body region (i.e., the collector 16 of the BJT 10) and the n$^-$-type drift region of the device. FIG. 2 also illustrates the lateral resistance 17 of the p-type body region. When the current flowing through the p-type body region reaches a sufficiently high value, it will produce a voltage drop across the resistance 17 that forward biases the p-n junction between the p-type body region and the n$^+$-type MOSFET source 24. As a result, the parasitic transistor 30, which forms part of a parasitic thyristor, is turned on, and a high level of electrons are injected from the n$^+$-type MOSFET source 24 into the p-type body region, and the ability to use the gate 22 to control the current flow through the device is lost. This condition is commonly referred to as "latch-up" of the parasitic thyristor, and when it occurs, it usually leads to the destruction of the device. Consequently, care must be taken to limit the on-state current densities through an IGBT in order to avoid latch-up of the parasitic thyristor. This characteristic of IGBT's also limits the IGBT's surge current capability.

Most power semiconductor devices are formed of silicon ("Si"), although a variety of other semiconductor materials have also been used. Silicon carbide ("SiC") is one of these alternate materials. Silicon carbide has potentially advantageous semiconductor characteristics including, for example, a wide band-gap, high electric field breakdown strength high thermal conductivity, high melting point and high-saturated electron drift velocity. Thus, relative to devices formed in other semiconductor materials such as, for example, silicon, electronic devices formed in silicon carbide may have the capability of operating at higher temperatures, at high power densities, at higher speeds, at higher power levels and/or under high radiation densities.

While the characteristics of the silicon carbide IGBT indicate promise as a power device, it can be difficult to fabricate high quality p-type silicon carbide substrates, and hole mobility may be low in silicon carbide. As such, silicon carbide IGBTs can be particularly susceptible to the above-described parasitic thyristor latch-up, which can significantly limit the maximum gate controlled on-state current density of these devices.

Several techniques for reducing the occurrence of latch-up have been utilized in silicon IGBT technology, typically at a cost in terms of on-state voltage drop and/or switching speed. These techniques include, for example, providing higher well doping concentrations, minority carrier by-pass, and providing an IGBT cell with a diverter. Typically, the diverter is realized by providing a minority carrier current conduction path through the transistor. In silicon carbide, however, due to the high (e.g., greater than 2.7 V) built-in potential of the collector-base junction in the bipolar junction transistor, the cell pitch of the IGBT must be large enough to reduce the JFET resistance of the device. Thus, the channel density is reduced.

SUMMARY

Pursuant to embodiments of the present invention, high power insulated gate bipolar junction transistors ("IGBTs") are provided that include a wide band gap semiconductor bipolar junction transistor ("BJT") having a collector, an emitter and a base and a wide band gap semiconductor MOSFET that is configured to provide a current to the base of the BJT. These IGBTs further include a minority carrier diversion semiconductor layer on the base of the BJT that has a conductivity type opposite the conductivity type of the base of the BJT and that forms a heterojunction with the base of the BJT.

In some embodiments, the BJT comprises a silicon carbide BJT, and the MOSFET comprises a silicon carbide MOSFET, and/or the minority carrier diversion semiconductor layer comprises a doped polysilicon layer. The heterojunction may have a first built-in potential that is lower than a second built-in potential of a homojunction of the material of the base.

In some embodiments, the IGBT may include an n-type injection layer, a p-type layer on the n-type injection layer, an n-well in an upper portion of the p-type layer, a heavily-doped p-type layer in an upper region of the n-well, a gate dielectric layer on the n-well and the heavily-doped p-type layer and a gate electrode on the gate dielectric layer. In such embodiments, the p-type layer on the n-type injection layer may comprise a p-type base layer that has a doping concentration that is less than a doping concentration of the heavily-doped p-type layer and a p-type drift layer on the p-type base layer having a doping concentration that is less than the doping concentration of the p-type base layer. The doped polysilicon layer may be between the gate dielectric layer and the p-type drift layer. In some embodiments, a top surface of the doped polysilicon layer may be farther above the n-type injection layer than is a top surface of the n-well. Moreover, a first channel region of the n-well that is on a first side of the heavily-doped p-type layer and that is under the gate electrode may be doped at a concentration that is substantially the same as a second region of the n-well that is on the opposite side of the heavily-doped p-type layer. The device may also include an electrical connection between the heavily-doped p-type layer and the minority carrier diversion semiconductor layer.

Pursuant to further embodiments of the present invention, high power insulated gate bipolar junction transistors are provided that include an n-type silicon carbide injection layer, a p-type silicon carbide base layer on the n-type silicon carbide injection layer, a p-type silicon carbide drift layer on the p-type silicon carbide base layer opposite the n-type silicon carbide injection layer, a silicon carbide n-well in an upper portion of the p-type silicon carbide drift layer, an n-type silicon layer on the p-type silicon carbide drift layer opposite the p-type silicon carbide base layer, a gate insulation layer on the silicon carbide n-well and the n-type silicon layer and a gate electrode on the gate insulation layer opposite the silicon carbide n-well and the n-type silicon layer.

In some specific embodiments, these IGBTs may further include a p-type silicon carbide emitter layer in an upper surface of the silicon carbide n-well. In such embodiments, the n-type silicon layer may be electrically connected to the p-type silicon carbide emitter layer. The silicon layer may comprise a minority carrier diverter that forms a heterojunction with the p-type silicon carbide drift layer. A top surface of the silicon layer may be farther above the n-type silicon carbide substrate than is a top surface of the silicon carbide n-well.

Pursuant to still further embodiments of the present invention, high power insulated gate bipolar junction transistors are provided that include a silicon carbide BJT having a collector region, an emitter region and a base region, a silicon carbide MOSFET having a source region, a drain region and a gate electrode and a doped semiconductor layer within a layer structure of the silicon carbide IGBT that forms a p-n heterojunction with a silicon carbide layer of the silicon carbide IGBT. The doped semiconductor layer may comprise a doped silicon layer and/or may act as a minority carrier diverter. A top surface of the doped polysilicon layer may be farther above an n-type substrate of the IGBT than is a top surface of the collector region of the BJT.

BRIEF DESCRIPTION OF DRAWINGS

FIG. 6B is a schematic cross-sectional diagram of the IGBT simulated in the graph of FIG. 6A that illustrates the current densities through the different regions of the device when the device is turned on.

FIG. 7B is a schematic cross-sectional diagram of the IGBT simulated in the graph of FIG. 7A that illustrates the current densities through the different regions of the device when the device is turned on.

DETAILED DESCRIPTION

Figure 1:
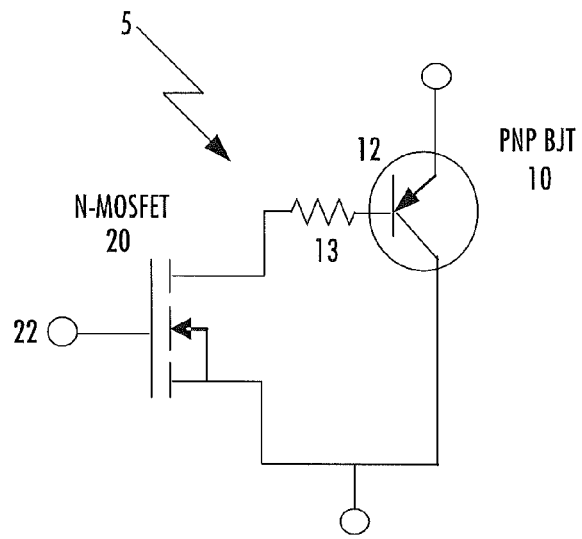
FIG. 1 is a simplified circuit diagram of a conventional IGBT.
Figure 2:
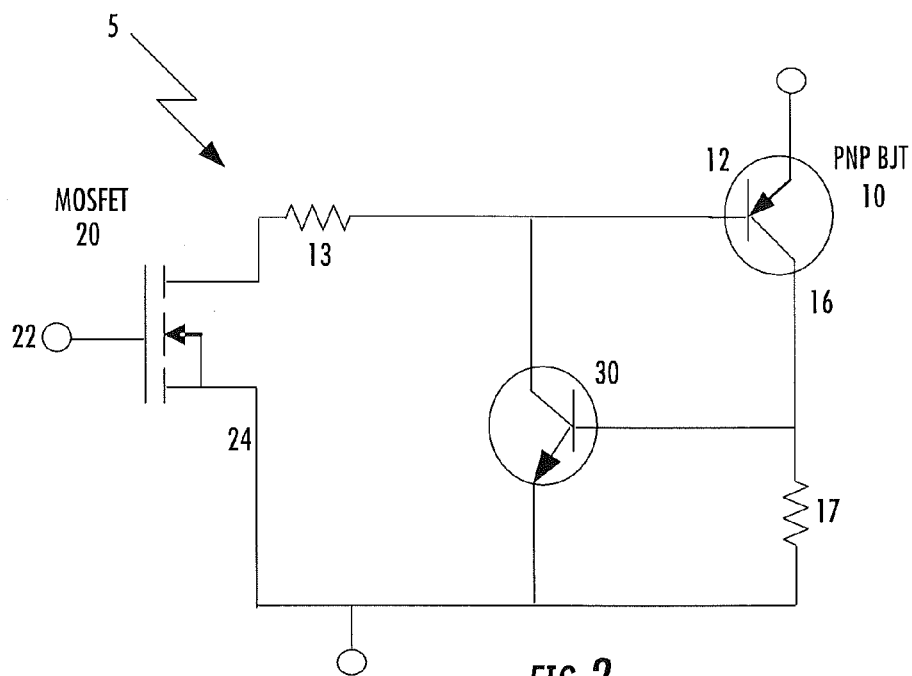
FIG. 2 is a more complete circuit diagram of the conventional IGBT of FIG. 1 that illustrates a parasitic transistor that may turn on at elevated current densities to cause latch-up of the IBGT.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or elements, these regions, layers and/or elements should not be limited by these terms. These terms are only used to distinguish one region, layer or element from another region, layer or element. Thus, a first region, layer or element discussed below could be termed a second region, layer or element, and similarly, a second region, layer or element may be termed a first region, layer or element without departing from the scope of the present invention.

Furthermore, relative terms, such as "lower" or "bottom" and "upper" or "top," may be used herein to describe one element's relationship to another elements as illustrated in the drawings. It will be understood that relative terms are intended to encompass different orientations of the device in addition to the orientation depicted in the drawings. For example, if the device in the drawings is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Embodiments of the invention are described herein with reference to cross-sectional illustrations that are schematic illustrations. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle may have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this disclosure and the relevant art and will not be interpreted in an idealized or overly formal sense unless expressly so defined herein.

Silicon carbide is a wide bandgap semiconductor that may offer as much as a factor of ten (10) higher electric field (E-field) breakdown as compared to silicon. Due to the high electric field breakdown, the drift region of, for example, a high voltage 4H—SiC switching device may be approximately one-tenth (1/10) as thick as that of a silicon device that has a comparable voltage rating. Consequently, full conductivity modulation of the drift layer in a 4H—SiC high-voltage bipolar switching device can be achieved with a minority carrier lifetime that is two orders of magnitude shorter than what is available in silicon devices due to the reduced thickness of the drift region. The thinner drift layers that may be used in 4H—SiC devices also translate into an order of magnitude smaller stored charge in the drift layer as compared to a silicon device. In light of these reductions in stored charge and minority carrier lifetime, high voltage 4H—SiC bipolar devices may provide up to three (3) orders of magnitude improvement in turn-off characteristics as compared to silicon devices having comparable voltage ratings.

Furthermore, due to the relatively high doping concentrations and negligible thermal generation of 4H—SiC drift layers, power devices having extremely high blocking voltages (e.g., more than 15 kV) can be fabricated using 4H—SiC, while the maximum blocking voltage in silicon power devices is more limited (e.g., to about 12 kV). Thus, in medium voltage drive applications (e.g., 13.8 kV to 69 kV), the use of 4H—SiC power devices can significantly reduce the total number of power components that are required to provide the requisite blocking voltages.

Silicon carbide n-channel and p-channel IGBTs having blocking voltages of 12 kV have been demonstrated on 4H—SiC. These 4H—SiC IGBTs offer excellent on-state current density because of their conductivity modulated drift layer. At the same time, these IGBTs employ an easy-to-control MOS gate, and have much faster switching characteristics than thyristors.

Figure 3:
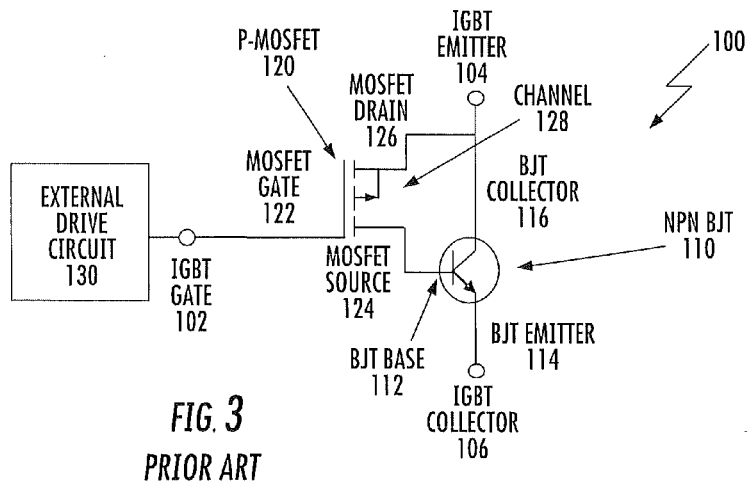
FIG. 3 is a circuit diagram of a conventional p-channel IGBT.
Figure 4:
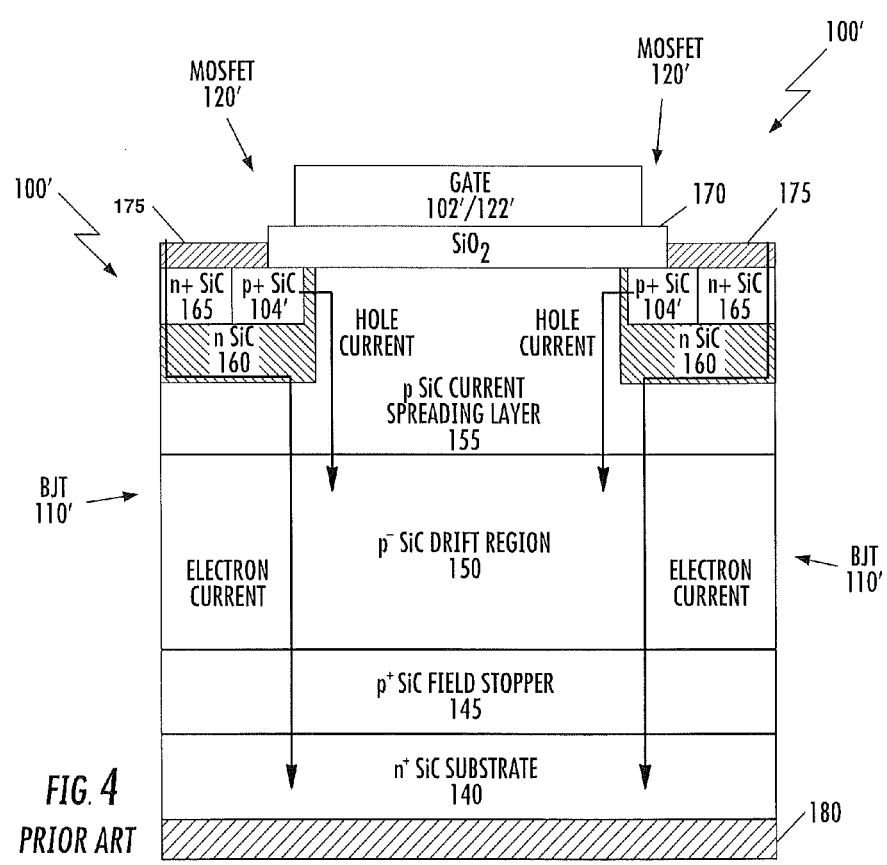
FIG. 4 is a schematic cross-sectional diagram of a pair of unit cells that may be used to form the p-channel IGBT of FIG. 3.

FIG. 3 is a circuit diagram of a conventional p-channel IGBT 100. FIG. 4 is a cross-sectional diagram of an implementation of two unit cells of the conventional IGBT 100 of FIG. 3.

As shown in FIG. 3, the IGBT 100 includes an NPN silicon carbide power BJT 110 that has a base 112, an emitter 114 and a collector 116. The IGBT 100 further includes a silicon carbide power MOSFET 120 having a gate 122, a source 124 and a drain 126. The source 124 of the silicon carbide power MOSFET 120 is electrically connected to the base 112 of the silicon carbide power BJT 110, and the drain 126 of the silicon carbide power MOSFET 120 is electrically connected to the collector 116 of the silicon carbide power BJT 110. As shown in FIG. 3, by convention, the collector 116 of the BJT 110 is the emitter 104 of the IGBT 100, and the emitter 114 of the BJT 110 is the collector 106 of the IGBT 100. The gate 122 of the MOSFET 120 also acts as the gate 102 of the IGBT 100.

The IGBT 100 may operate as follows. An external drive circuit 130 is connected to the gate 102 of the IGBT 100 for applying a gate bias voltage to the power MOSFET 120. When this external drive circuit 130 applies a voltage to the gate 102 of IGBT 100 that is greater than the threshold voltage of the MOSFET 120, an inversion layer is formed under the gate 102 which acts as a channel 128 that electrically connects the $p^+$ emitter 104 of the IGBT 100 (i.e., the collector 116 of BJT 110) to the base 112 of BJT 110. Holes are injected from the $p^+$ emitter region 104 through the channel 128 into the base 112. This hole current acts as the base current that drives the BJT 110. In response to this hole current, electrons are injected from the collector 106 of IGBT 100 (i.e., the emitter 114 of BJT 110) across the base 112 to the emitter 104 of IGBT 100 (i.e., the collector 116 of BJT 110). Thus, the silicon carbide power MOSFET 120 converts the silicon carbide power BJT 110 from a current driven device to a voltage driven device, which may allow for a simplified external drive circuit 130. The silicon carbide power MOSFET 120 acts as a driver transistor, and the silicon carbide power BJT 110 acts as the output transistor of the IGBT 100.

FIG. 4 is a schematic cross-sectional diagram of (a) two individual MOSFETs 120' that are used to form part of the power MOSFET 120 of FIG. 3 and (b) two individual BJTs 110' that are used to form part of the power BJT 110 of FIG. 3. It will be appreciated that to form the power IGBT 100, the plurality of individual MOSFETs 120' would be implemented in parallel and the plurality of the individual BJTs 110' would be implemented in parallel. In some embodiments, the individual MOSFETs 120' may be spatially separated from the individual BJTs 110' while, in other embodiments, the individual MOSFETs 120' and the individual BJTs 110' may be intermixed throughout the device. In either case, the combination of an individual MOSFET 120' and an individual BJT 110 may functionally be viewed as a unit cell 100' of the IGBT 100.

As shown in FIG. 4, the MOSFETs 120' and the BJTs 110' may be formed on the same bulk single crystal n-type silicon carbide substrate 140. In some embodiments, the substrate 140 may be omitted. A $p^+$ silicon carbide field stopper layer 145 is provided on the substrate 140. The p-type field stopper layer 145 may be epitaxially grown and may be, for example, about 0.2 microns thick, and may be doped to a concentration of about $5 \times 10^{17}$ cm$^{-3}$. A lightly p-type doped ($p^-$) silicon carbide drift layer 150 is provided on the field stopper layer 145. The p-type drift layer 150 may be, for example, a 100 micrometer (μm) thick epitaxial layer doped at a concentration of about $2 \times 10^{14}$ cm$^{-3}$. The minority carrier lifetime in the lightly doped drift layer 150 is approximately 2 microseconds (μs). A p-type silicon carbide current spreading layer 155, which may also be epitaxially grown, is provided on the drift region 150. A pair of silicon carbide n-wells 160 are provided in an upper surface of the p-type silicon carbide current spreading layer 155. A $p^+$ silicon carbide region 104' is formed in a central portion of each n-well 160. A heavily-doped $n^+$ silicon carbide layer 165 may also be formed in the upper portion of each n-well 160 adjacent the $p^+$silicon carbide region 104'. An ohmic contact 175 is formed to contact the $n^+$ silicon carbide region 165 and the $p^+$ silicon carbide region 104' of each unit cell, and an ohmic contact 180 is formed on the back side of the $n^+$ silicon carbide substrate 140. A gate insulating layer 170 such as a silicon dioxide layer is formed over the p-type silicon carbide current spreading layer 155, a top portion of the n-wells 160 and onto the $p^+$ silicon carbide regions 104'. Finally, a MOSFET gate 122' such as, for example, a silicon carbide layer is formed on the gate insulating layer 170. As noted above, this MOSFET gate 122' also acts as the gate 102' of the unit cell 100'. A MOSFET channel is thereby defined in each of the n-wells 160 between the $p^+$ region 104' and the p-type current spreading layer 155.

With regard to the carrier concentrations, the $p^+$ and $n^+$ conductivity type regions and epitaxial layers described above may be as heavily doped as possible without causing excessive fabrication defects. Suitable dopants for producing the p-type silicon carbide regions include aluminum, boron or gallium. Suitable dopants for producing the n-type silicon carbide regions include nitrogen and phosphorus.

The n+ silicon carbide regions 165 act (as the collectors 116 of the BJT s 110' that are part of each IGBT 100'. The p-type silicon carbide layers 145, 150, 155 act as the base 112' of the BJT 110', and the n+ silicon carbide substrate 140 acts as the emitter 114' of the BJTs 110'. The p+ silicon carbide regions 104' act as the drain region 126' of the respective MOSFETs 120', and the p-type silicon carbide current spreading layer 155 acts as the source region 124' of the MOSFETS 120'. The upper portion of the n-wells 160 between the p+ silicon carbide regions 104' and the p-type silicon carbide current spreading layer 155 comprise the channels 128' of the respective MOSFETS 120'.

While FIGS. 3 and 4 illustrate the structure of a unit cell 100' of a p-channel IGBT 100 according to embodiments of the present invention, it will be appreciated that n-channel IGBTs may be provided pursuant to further embodiments of the present invention. For example, in one such embodiment, a unit cell of an n-channel IGBT may be provided that has the same structure as shown in FIG. 4, except that the polarity of each of the semiconductor layers is reversed.

Referring again to FIG. 4, operation of the unit cell 100' will now be discussed. When a bias voltage that exceeds the threshold voltage of the MOSFETs 120' is applied to the gate 122', a hole current flows across the channels 128' of each MOSFET 120' into the base of the BJTs 110', as indicated by the arrows labeled "hole current" in FIG. 4. Vertical conduction of this base current through the p-type current spreading layer 155 is though a JFET region defined between the n-wells 160. In response to this base current, an electron current flows from the collector 116' of each BJT 110' (i.e., SiC region 165 in FIG. 4) through the n-wells 160 to the emitter 114' of each BJT 110' (i.e., substrate 140 in FIG. 4).

The transconductance and maximum controllable current density are much higher for p-channel IGBTs than for n-channel IGBTs. This difference can be explained by the ratio of carrier mobilities of electrons to holes, i.e., $\mu_{e,bulk}/\mu_{h,bulk}$, which is approximately ten (10) in 4H—SiC. The ratio between electron current and hole current in IGBTs is determined by the ratio of the carrier mobilities. Therefore electron current is approximately 10 times larger than the hole current in 4H—SiC, regardless of the polarity. In n-channel 4H—SiC IGBTs, most of the current flows through the MOSFET channel (since electron current dominates), and thus the transconductance and the saturation current ($I_{DSS}$) of an n-type 4H—SiC IGBT may be limited by the MOSFET channel mobility. In contrast, the MOSFET channel in a 4H—SiC p-channel IGBT carries only a small fraction of the total current, and most of the current flows through the collector of the wide base NPN BJT, resulting in a significant gain enhancement and a much higher saturation current.

The conductivity modulation of the drift layer depends on the injection of minority carriers from the back side (e.g., from the substrate), and on the diffusion length of the injected minority carriers. As temperatures are increased, the carrier lifetime likewise increases. However, mobility decreases with increasing temperature at an even faster rate, and hence the diffusion length is reduced with increasing temperature. In 4H—SiC bipolar devices, diffusion lengths of electrons are approximately three (3) times larger than those of holes, given the same carrier lifetime, due to the higher electron mobility. Therefore, it is much easier to maintain full conductivity modulation of the drift layer over the entire range of operating temperatures for the p-channel IGBTs (in which electrons are the minority carriers), than in n-channel IGBTs (in which holes are the minority carriers).

As discussed above, unfortunately IGBTs include a parasitic thyristor which can "latch-up" under certain circumstances. Referring, for example, to FIG. 4, as the electron current flowing through the unit cells 100' increases, a voltage difference appears between each n-well region 160 and its associated p+ region 104'. Once this voltage difference reaches a threshold amount (e.g., about 2.7 volts in a typical silicon carbide IGBT), the p-n junction formed by the n-well region 160 and the p+ region 104' turns on. Once this has occurred, the electron current will continue to flow from the collector 116' to the emitter 114', even if the bias voltage that is applied to the gate 122' is removed. Consequently, the IGBT 100 can only be used at current densities that are less than the current density required to turn on the p-n junction, as once that threshold current density is reached, control of the IGBT 100 may be lost.

While silicon-based IGBTs also have limitations in terms of controllable current density, electron mobility in silicon is typically 2-3 times the hole mobility, whereas, as discussed above, in the drift region of a 4H—SiC-based IGBT, the electron mobility will typically be more than 10 times the hole mobility. As a result, in silicon carbide IGBTs, the vast majority of the current comprises electron current that flows from the collector 116', through the n-well 160, to the emitter 114'. Thus, silicon carbide IGBTs are inherently more prone to latch-up because the current flowing through the n-well that causes this latch up builds more quickly due to the pronounced difference in electron and hole mobilities in silicon carbide.

Pursuant to embodiments of the present invention, high voltage silicon carbide IGBTs are provided that have a silicon layer that acts as a minority carrier diversion path or "minority carrier diverter." The silicon layer that is provided in the silicon carbide IGBTs according to embodiments of the present invention may provide a conduction path that may carry a significant percentage of the minority carrier current through the device, thereby increasing the on-state current density of the device that is required to make the parasitic thyristor in the IGBT structure latch-up. Consequently, the silicon carbide IGBTs according to embodiments of the present invention may have significantly increased controllable current densities.

One technique for reducing latch-up in a silicon IGBT is to provide an n-well under the gate that acts as a minority current diversion path. A significant amount of the minority current (e.g., 50 percent) can flow through this minority current diversion path, thereby reducing the current flow through the p-n junction so as to allow larger current densities without latch-up of the parasitic thyristor.

In a silicon carbide IGBT, a silicon carbide n-well could be formed under the gate of the device to provide such a minority current diversion path. However, the cell pitch would be greatly increased. In contrast, if a silicon n-well is formed as a minority current diversion path in a silicon carbide IGBT, a small cell pitch could be maintained, and the gate-source capacitance $C_{GS}$ is reduced as well.

Pursuant to embodiments of the present invention, silicon carbide IGBTs are provided that include unit cells that have a minority carrier diverter within the cell. The minority carrier diverter may be formed by providing a p-n heterojunction on the epitaxial device structure, where the semiconductor layer that forms the minority carrier diverter has a built-in potential that is less than the built-in potential of a silicon carbide homojunction (herein "homojunction" refers to a p-n junction of two layers that are formed of the same base material). For example, in some embodiments, the minority carrier diverter may be formed by providing a polysilicon film on the epitaxial device structure, the polysilicon film having a conductivity type opposite the conductivity type of the drift region of the device. Thus, for example, in a p-channel IGBT according to embodiments of the present invention the minority carrier diverter may comprise an n-type silicon film. The conduction path provided by the minority carrier diverter can divert a significant amount of the total minority carrier current away from the n-wells of the device, and thus may dramatically reduce the occurrence of latch-up in the parasitic thyristor that is present in the device. As such, the power silicon carbide IGBTs according to embodiments of the present invention may have increased controllable current densities.

According to some embodiments, instead of forming a minority carrier diverter by ion implantation to form an p-n junction in the device (using a p-IGBT structure as an example), an $n^+$ polysilicon/p-type silicon carbide heterojunction is formed that is electrically connected to the emitter of the IGBT by, for example, a conductive layer. This n+ polysilicon/p-type silicon carbide heterojunction is located in the JFET gap region to divert minority carrier current (i.e., electron current in the case of a p-channel IGBT) away from the implanted n-wells. The built-in potential between the n-type polysilicon and the p-type silicon carbide may be, for example, about 1.2 V. In contrast, the built-in potential of a silicon carbide homojunction may be, for example, about 2.7 V.

Figure 5:
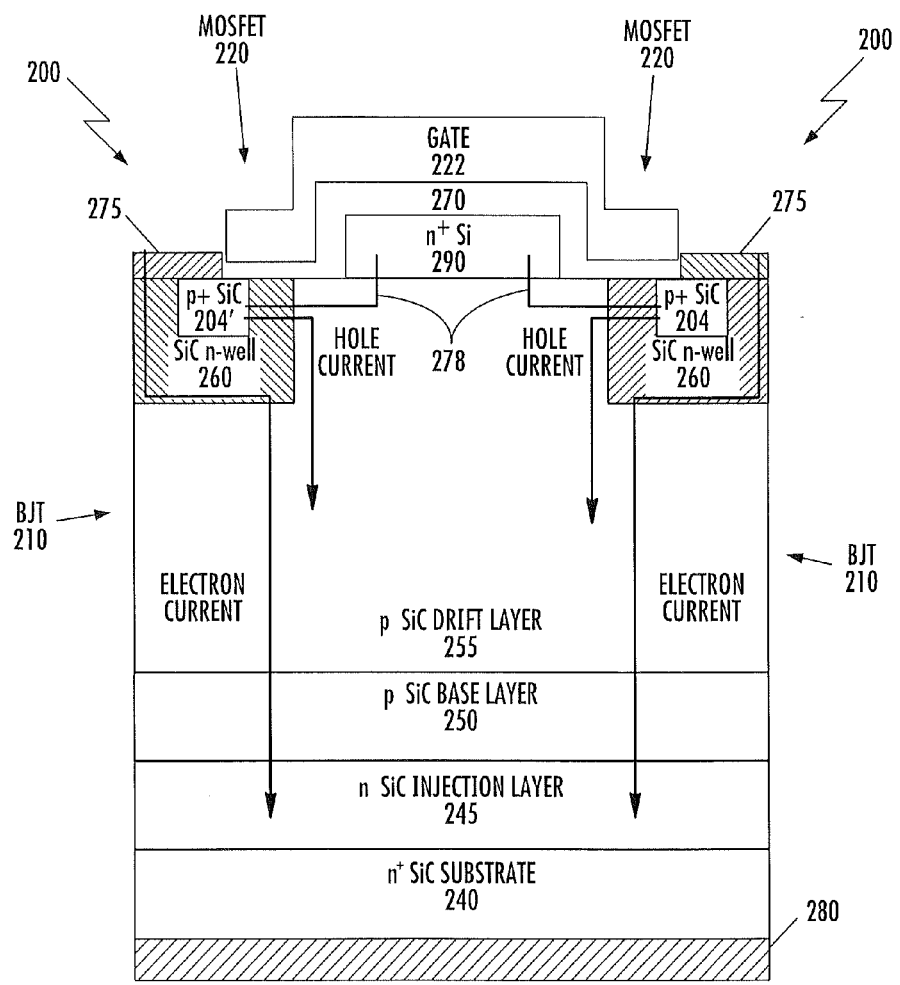
FIG. 5 is a schematic cross-sectional diagram of a pair of unit cells of a p-channel IGBT according to certain embodiments of the present invention.

A pair of unit cells 200 of a p-type 4H—SiC IGBT according to some embodiments of the present invention is illustrated in the cross-sectional diagram of FIG. 5. The unit cells 200 illustrated in FIG. 5 may be part of an IGBT that has, for example, a 15 kV blocking capability. The IGBT that the unit cells 200 are a part of may have the same circuit diagram as the IGBT 100 illustrated in FIG. 3.

As shown in FIG. 5, the unit cells 200 are formed on a heavily doped $n^+$ 4H silicon carbide substrate 240. A moderately doped n-type silicon carbide injection layer 245 is formed on the silicon carbide substrate 240 by, for example, epitaxial growth. A moderately doped p-type silicon carbide base layer 250 is formed on the n-type silicon carbide injection layer 245. A lightly doped (e.g., about $1\times10^{14}$ cm$^{-3}$ or lower) p-type drift silicon carbide layer 255 having a thickness of, for example, about 150 micrometers is formed on the p-type silicon carbide base layer 250. All of the layers 245, 250 and 255 may comprise 4H—SiC layers.

As is further shown in FIG. 5, a pair of silicon carbide n-wells 260 are provided in an upper surface of the p-type silicon carbide drift layer 255. A heavily-doped $p^+$ silicon carbide region 204 is formed in a central portion of each silicon carbide n-well 260. An ohmic contact 275 is formed on each $p^+$ silicon carbide region 204 and on the a portion of each silicon carbide n-well 260. An ohmic contact 280 is formed on the backside of the $n^+$ silicon carbide substrate 240. A gate insulating layer 270 such as a silicon dioxide layer is formed over the $p^-$ silicon carbide drift layer 255, a portion of each n-well 260 and a portion of each $p^+$ silicon carbide region 204. Finally, a gate 222 such as, for example, a silicon carbide layer is formed on the gate insulating layer 270. A MOS channel is thereby defined in each of the n-wells 260 between the $p^+$ region 204 and the p-type silicon carbide drift layer 255.

The IGBT that includes the unit cells 200 provides significant gain enhancement, as the electron current is approximately an order of magnitude larger than the hole current that flows through the MOS channel of the device. This gain enhancement feature has a significant implication to the device reliability because, in both n-channel or p-channel 4H—SiC MOS power devices, a very high E-field is typically applied to the gate dielectric (i.e., gate insulating layer 270 of FIG. 5) to turn the device on to compensate for the low MOS effective channel mobility. Because only a small current flows through the MOS channel in a p-channel IGBT while the bulk of the on-state current flows through the NPN structure of the bipolar transistor, a significantly lower E-field can be applied to the gate dielectric layer while still achieving a reasonably high on-state current density. As such, the reliability of the gate dielectric can be substantially improved. However, as discussed above, the increased current through the NPN structure of the device that results from this gain enhancement also increases the possibility of latch-up of the parasitic thyristor. Therefore, care must be taken to reduce or minimize the risk of latch-up in the device.

Figure 5A:
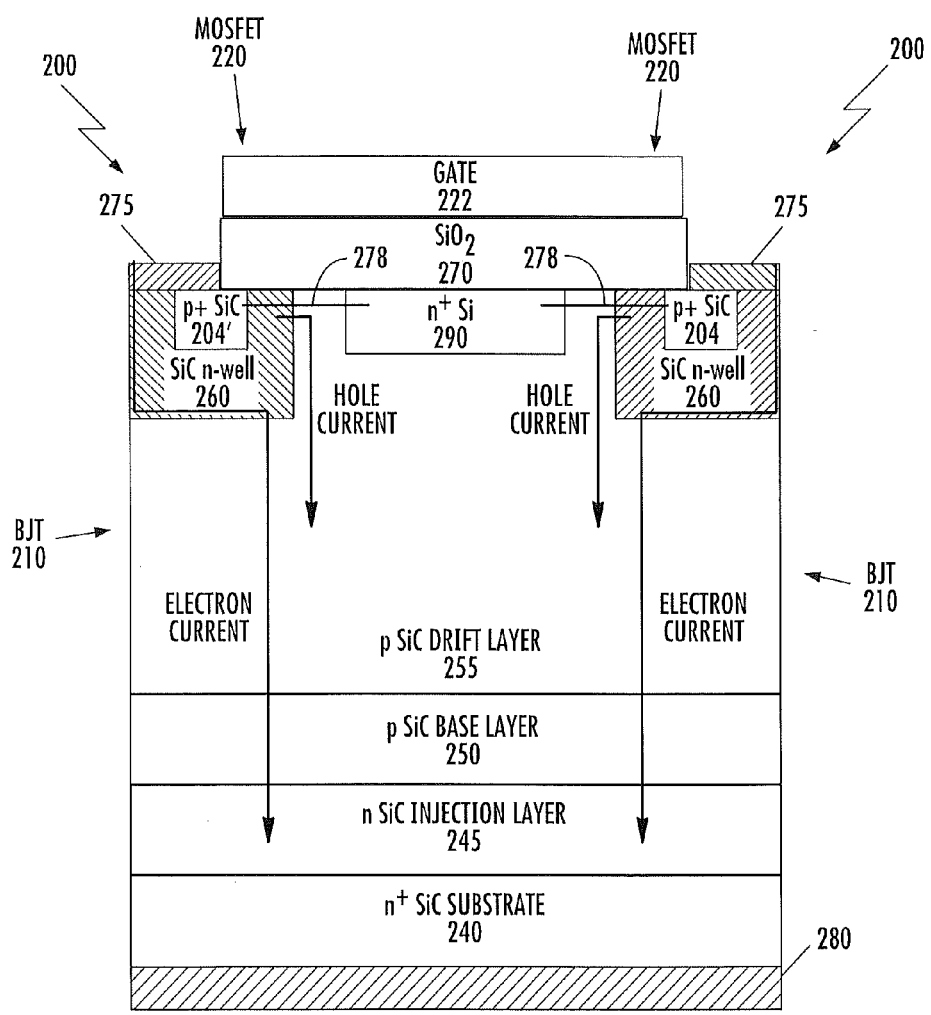
FIG. 5A is a schematic cross-sectional diagram of a pair of unit cells of a p-channel IGBT according to further embodiments of the present invention.

In order to increase the controllable current densities that may be supported by the device, the IGBT 200 of FIG. 5 further includes an $n^+$ polysilicon layer 290 which forms a heterojunction with the p-type silicon carbide drift layer 255. The polysilicon layer 290 may be formed on the p-type silicon carbide drift layer 255 in the JFET gap region between the silicon carbide n-wells 260 by, for example, chemical vapor deposition or sputtering. As shown in FIG. 5, in some embodiments, the polysilicon layer 290 may be formed on the top surface of the p-type silicon carbide drift layer 255 such that the bottom surface of the polysilicon layer 290 is substantially aligned with the top surfaces of the n-wells 260. As shown in FIG. 5A, in other embodiments, a central portion of the p-type silicon carbide drift layer 255 may be recessed, and the polysilicon layer 290 may be formed in the recessed region of the drift layer 255. In such embodiments, a top surface of the polysilicon layer 290 may be at substantially the same height above the substrate 240 as are the top surfaces of the n-wells 260. In both the embodiments of FIG. 5 and FIG. 5A, the polysilicon layer 290 may be electrically connected to the regions 204 to provide a current path from the substrate 240 to the regions 204 that flows through the polysilicon layer 290. In certain embodiments, the electrical connection between the polysilicon layer 290 and the regions 204 may be located in, for example, a corner of the device cell outside the plane illustrated in FIG. 5. This electrical connection is schematically illustrated in FIGS. 5 and 5A by bold lines that are labeled 278.

In both the embodiments of FIGS. 5 and 5A, the polysilicon layer 290 acts as a minority current diverter that can divert a substantial portion of the minority carrier current away from the implanted n-wells 260. As the voltage drop across the n-wells 260 is a function of the current density that passes through the n-wells, the minority current diverter 290 can dramatically reduce the occurrence of latch-up of the parasitic thyristor, thus potentially increasing the controllable current density of the device.

As discussed above, in the embodiment of FIG. 5, the polysilicon layer 290 is formed on a top surface of the drift layer 255 such that the polysilicon layer 290 is above the JFET region of the drift layer 255 that is disposed between the n-wells 260. If the minority current diverter 290 is located in the JFET region instead, as is the case in the embodiment of FIG. 5A, it can reduce the width of the channel through the JFET region of the drift layer 255 that carries the base current, thereby causing the resistance in the JFET region to increase. This increase in resistance may act to decrease the base current of the IGBT which, in turn, decreases the minority current density through the device. Thus, by forming the polysilicon layer 290 above the JFET region as in the embodiment of FIG. 5, the increase in resistance in the JFET region of the drift layer 255 may be reduced, allowing the device to support larger current densities.

The minority carrier diverter 290 also reduces the degree to which the gate electrode directly overlaps the p-type drift layer 255 through the gate insulating layer. As a result, by including the minority carrier diverter 290 it is possible to reduce the power that the gate drive circuitry must provide to turn on the IGBT. Thus, for a constant gate drive, the IGBTs according to embodiments of the present invention may provide increased switching speed.

As shown in FIG. 5, in some embodiments, a central portion of the gate insulating layer 270 that is above and/or on the sides of the polysilicon layer 290 may be thicker than the outside portions of the gate insulating layer 270 that extend over the n-wells 260 and the p⁺ silicon carbide layers 204. This thicker oxide layer may reduce the effects of oxide layer deterioration that can occur given the high electric field that is applied across the central portion of the gate insulating layer 270.

Figure 6A:
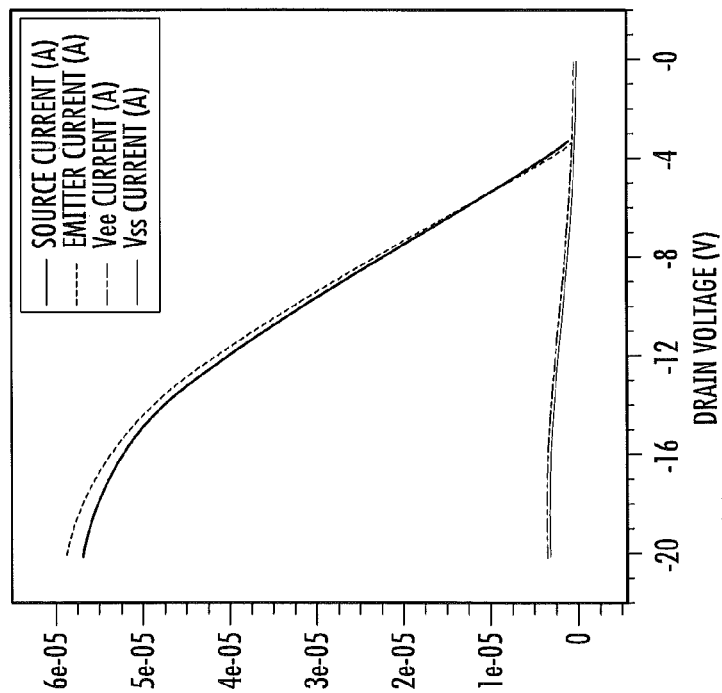
FIG. 6A is a graph showing the simulated current that flows through each of the top electrodes of a conventional silicon carbide IGBT that has the structure of the device illustrated in FIGS. 3 and 4.
Figure 6B:
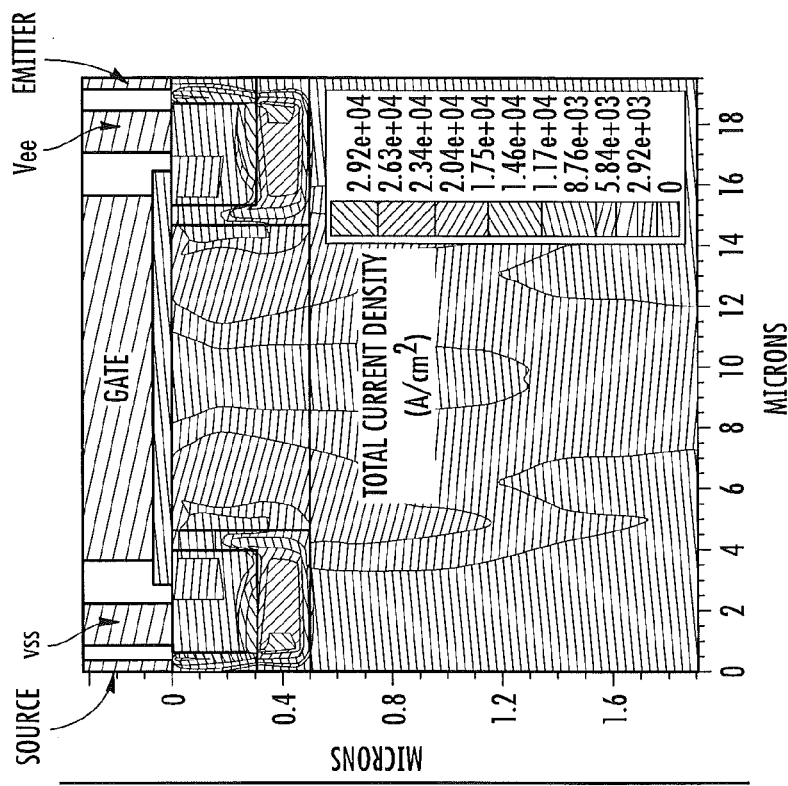

FIG. 6A is a graph showing the simulated current flow through each of the top electrodes of a conventional 4H—SiC IGBT having the structure of FIGS. 3 and 4 (i.e., electrodes 175 in the unit cells 100' of FIG. 4). FIG. 6B is a simplified cross-sectional diagram of a unit cell of the IGBT structure of FIG. 3 that shows the current densities through the different regions of the device when the IGBT is in its "on" state. As shown in FIGS. 6A and 6B, at high drain voltages (i.e., the voltage applied to the substrate), the current is predominantly electron current that flows through the n-wells 160 and the n⁺ silicon carbide regions 165. For example, at a drain voltage of −20 volts, the electron current through the n⁺ silicon carbide regions 165 is approximately 30 A/cm², whereas the base hole current that flows through the p⁺ silicon carbide regions 104 is less than 15 A/cm². As discussed above, as the currents through the n-wells 160 and the n⁺ silicon carbide regions 165 become large, the IGBT can latch-up as a result of the parasitic thyristor.

Figure 7A:
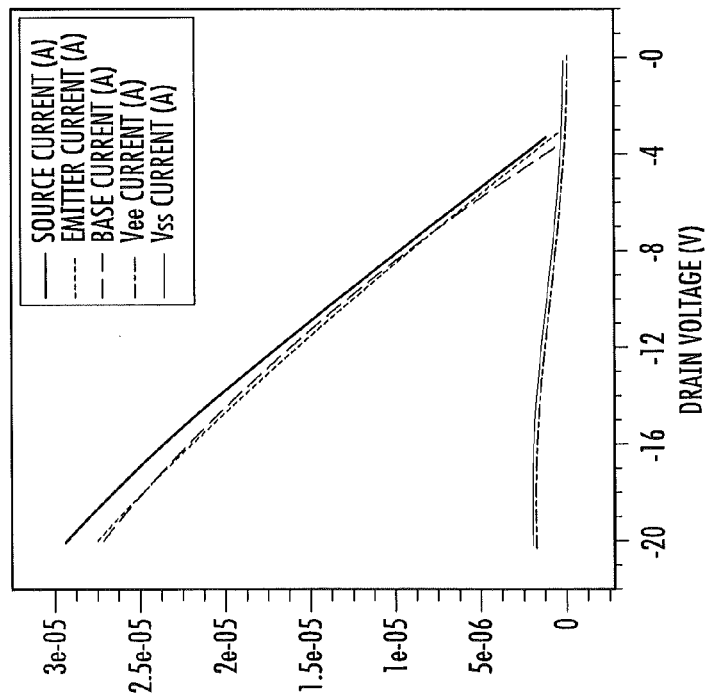
FIG. 7A is a graph showing the simulated current that flows through each of the top electrodes of a silicon carbide IGBT according to certain embodiments of the present invention that has the structure of the device illustrated in FIG. 5.
Figure 7B:
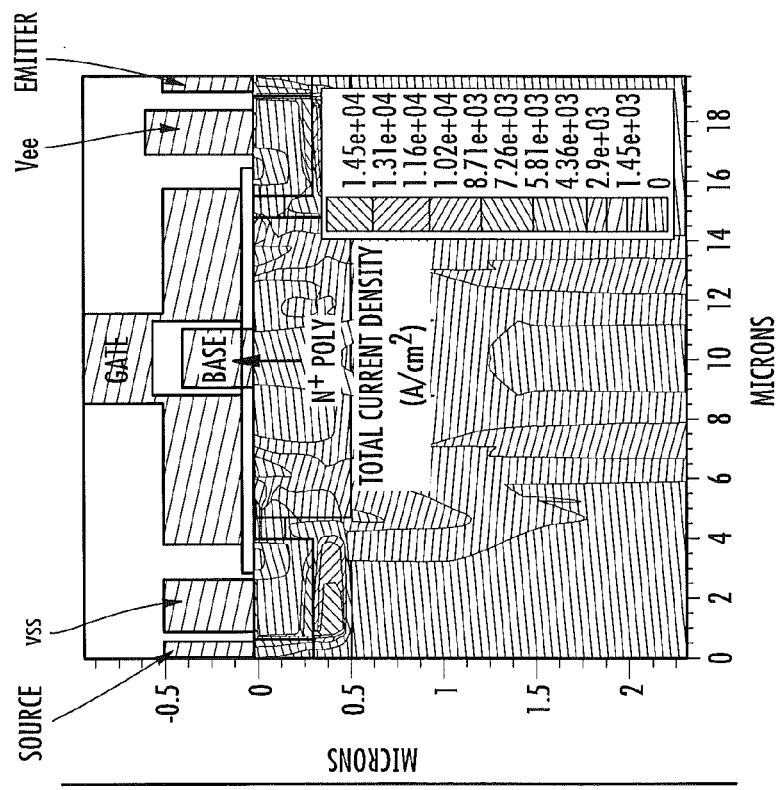

In comparison, FIG. 7A illustrates the simulated current flow through each of the top electrodes of a 4H—SiC IGBT according to an embodiment of the present invention that has the structure of the IGBT 200 of FIG. 5A. FIG. 7B is a simplified cross-sectional diagram of the IGBT structure of FIG. 5A that shows the current densities through the different regions of the device when the IGBT is in its "on" state. As shown in FIGS. 7A and 7B, at high drain voltages (i.e., the voltage applied to the substrate), the amount of electron current that flows through the polysilicon minority current diverter 290 is approximately equal to the amount of electron current that flows through one of the n-wells 260 and the n⁺ silicon carbide regions 265. This shows that a substantial amount of the electron current is being diverted away from the n-wells 260 and the n⁺ silicon carbide regions 265, thereby reducing the possibility of latch-up while still supporting large current densities through the device. As a result, about one third of the total forward current conducts through the base of the device, which represents the collector current of the transistor having an n⁺ polysilicon/p-silicon carbide/n-substrate structure. Thus the latch-up current density may be significantly improved as a result of including a minority current diverter according to some embodiments of the present invention.

It will be appreciated that numerous changes may be made to the devices of FIGS. 5 and 5A without departing from the scope of the present invention. For example, while the silicon carbide IGBTs illustrated in FIGS. 5 and 5A each have a planar structure, the minority carrier diverters according to embodiments of the present invention could likewise be included in IGBTs that have a MOSFET gate which has a trench structure. As another example, while the IGBTs discussed above comprise silicon carbide IGBTs, it will likewise be appreciated that in other embodiments a different wide band-gap semiconductor than silicon carbide could be used, and/or the minority carrier diverter cold be formed of a material other than polysilicon such as, for example, single-crystalline silicon, silicon-germanium, etc. In still other embodiments, the shape and/or location of the minority carrier diverter could be varied from the shapes and positions shown in FIGS. 5 and 5A. Thus, it will be appreciated that the above embodiments are not intended to be limiting, but instead illustrate exemplary embodiments of the present invention.

As discussed above, the IGBTs according to embodiments of the present invention may route a significant portion of the current outside the n-wells, thereby allowing the devices to support larger current densities without an increased risk of latch up. Additionally, since the polysilicon minority current diverter shields the gate from the collector, the gate-drain input capacitance may be reduced, which may significantly reduce the gate charge. Moreover, with respect to p-channel IGBTs according to embodiments of the present invention, the gain enhancement that is provided by the much larger electron current allows the application of lower gate E-fields to turn the device on. As the gate oxide of the device can deteriorate over time due to the repeated application of high electric fields, the lower electric fields that can be applied to the p-channel IGBTs according to embodiments of the present invention can provide improved device stability and/or reliability. Additionally, the fabrication process for manufacturing the above-described IGBTs is compatible with conventional IGBT fabrication processes.

While the present invention has been primarily described above with respect to silicon carbide devices that include a silicon minority carrier diverter, it will be appreciated that in other embodiments the device could comprise a wide band-gap semiconductor other than silicon carbide such as, for example, gallium nitride, zinc zelenide or any other II-VI or III-V wide band gap compound semiconductor. Herein, the term wide band-gap encompasses any semiconductor having a band-gap of at least 1.4 eV. It will likewise be appreciated that the minority carrier diverter may comprise a semiconductor other than silicon.

While the above embodiments are described with reference to particular figures, it is to be understood that some embodiments of the present invention may include additional and/or intervening layers, structures, or elements, and/or particular layers, structures, or elements may be deleted. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed is:

1. A high power insulated gate bipolar junction transistor ("IGBT"), comprising:
   a wide band gap semiconductor bipolar junction transistor ("BJT") having a collector, an emitter and a base;
   a MOSFET having a gate, a source region, a drain region and a channel region extending between the source region and the drain region, wherein the source region, the drain region and the channel region comprise a first wide band gap semiconductor material, and wherein the MOSFET is configured to provide a current to the base of the BJT; and a minority carrier diversion semiconductor layer between the base of the BJT and the gate of the MOSFET configured to divert a portion of the minority carrier current flow through the IGBT, the minority carrier diversion semiconductor layer having a conductivity type opposite the conductivity type of the base of the BJT and forming a heterojunction with the base of the BJT.

2. The high power IGBT of claim 1, wherein the wide band gap semiconductor BJT comprises a BJT having a silicon carbide base, a silicon carbide collector and a silicon carbide emitter, and wherein the MOSFET comprises a silicon carbide MOSFET.

3. The high power IGBT of claim 2, wherein the minority carrier diversion semiconductor layer comprises a doped polysilicon layer.

4. The high power IGBT of claim 3, wherein the IGBT includes:
an n-type injection layer;
a p-type layer on the n-type injection layer;
an n-well in an upper portion of the p-type layer;
a heavily-doped p-type layer in an upper region of the n-well; and
a gate dielectric layer between the gate and the n-well.

5. The high power IGBT of claim 4, wherein the p-type layer on the n-type injection layer comprises a p-type base layer that has a doping concentration that is less than a doping concentration of the heavily-doped p-type layer, and a p-type drift layer on the p-type base layer having a doping concentration that is less than the doping concentration of the p-type base layer.

6. The high power IGBT of claim 5, wherein the doped polysilicon layer is between the gate dielectric layer and the p-type drift layer.

7. The high power IGBT of claim 6, wherein a first channel region of the n-well that is on a first side of the heavily-doped p-type layer and that is under the gate electrode is doped at a concentration that is substantially the same as a second region of the n-well that is on the opposite side of the heavily-doped p-type layer.

8. The high power IGBT of claim 6, wherein a top surface of the doped polysilicon layer is even with or below a top surface of the n-well.

9. The high power IGBT of claim 4, wherein a thickness of a middle portion of the gate dielectric layer that is on the doped polysilicon layer is greater than a thickness of an end portion of the gate insulation layer that is on the n-well.

10. The high power IGBT of claim 4, further comprising an electrical connection between the heavily-doped p-type layer and the minority carrier diversion semiconductor layer.

11. The high power IGBT of claim 2, wherein the minority carrier diversion semiconductor layer is not a wide band gap semiconductor layer.

12. The high power IGBT of claim 1, wherein the a channel of the MOSFET comprises a silicon carbide channel.

13. The high power IGBT of claim 1, wherein the collector of the BJT has a first conductivity type and is disposed in a well region that has a second conductivity type, wherein the minority carrier diversion semiconductor layer has a second conductivity type, and wherein a semiconductor region having the first conductivity type is disposed between the well region and the minority carrier diversion semiconductor layer.

14. A high power insulated gate bipolar junction transistor ("IGBT"), comprising:
a wide band gap semiconductor bipolar junction transistor ("BJT") having a collector, an emitter and a base;
a MOSFET that is configured to provide a current to the base of the BJT; and
a minority carrier diversion semiconductor layer between the base of the BJT and a gate of the MOSFET that is configured to divert a portion of the minority carrier current flow through the IGBT, the minority carrier diversion semiconductor layer having a conductivity type opposite the conductivity type of the base of the BJT and forming a heterojunction with the base of the BJT,
wherein the wide band gap semiconductor BJT comprises a silicon carbide BJT,
wherein the MOSFET comprises a silicon carbide MOSFET,
wherein the minority carrier diversion semiconductor layer comprises a doped polysilicon layer,
wherein the IGBT includes an n-type injection layer, a p-type layer on the n-type injection layer, an n-well in an upper portion of the p-type layer, a heavily-doped p-type layer in an upper region of the n-well, a gate dielectric layer on the n-well and the heavily-doped p-type layer, and a gate electrode on the gate dielectric layer,
wherein the p-type layer on the n-type injection layer comprises a p-type base layer that has a doping concentration that is less than a doping concentration of the heavily-doped p-type layer, and a p-type drift layer on the p-type base layer having a doping concentration that is less than the doping concentration of the p-type base layer,
wherein the doped polysilicon layer is between the gate dielectric layer and the p-type drift layer, and
wherein a top surface of the doped polysilicon layer is farther above the n-type injection layer than is a top surface of the n-well.

15. A high power p-channel silicon carbide insulated gate bipolar junction transistor ("IGBT"), comprising:
an n-type silicon carbide injection layer;
a p-type silicon carbide base layer on the n-type silicon carbide injection layer;
a p-type silicon carbide drift layer on the p-type silicon carbide base layer opposite the n-type silicon carbide injection layer;
a silicon carbide n-well in an upper portion of the p-type silicon carbide drift layer;
a p-type silicon carbide emitter region in the silicon carbide n-well and directly contacting the silicon carbide n-well;
an n-type silicon layer on the p-type silicon carbide drift layer opposite the p-type silicon carbide base layer;
a gate insulation layer on the silicon carbide n-well and the n-type silicon layer; and
a gate electrode on the gate insulation layer opposite the silicon carbide n-well and the n-type silicon layer.

16. A high power p-channel silicon carbide insulated gate bipolar junction transistor ("IGBT"), comprising:
an n-type silicon carbide injection layer;
a p-type silicon carbide base layer on the n-type silicon carbide injection layer;
a p-type silicon carbide drift layer on the p-type silicon carbide base layer opposite the n-type silicon carbide injection layer;
a silicon carbide n-well in an upper portion of the p-type silicon carbide drift layer;
an n-type silicon layer on the p-type silicon carbide drift layer opposite the p-type silicon carbide base layer;

a gate insulation layer on the silicon carbide n-well and the n-type silicon layer;

a gate electrode on the gate insulation layer opposite the silicon carbide n-well and the n-type silicon layer; and a p-type silicon carbide emitter layer in an upper surface of the silicon carbide n-well, wherein the n-type silicon layer is electrically connected to the p-type silicon carbide emitter layer.

17. The high power p-channel silicon carbide IGBT of claim 16, wherein the silicon layer comprises a minority carrier diverter that forms a heterojunction with the p-type silicon carbide drift layer.

18. The high power p-channel silicon carbide IGBT of claim 17, further comprising an n-type silicon carbide substrate on the n-type silicon carbide injection layer opposite the p-type silicon carbide base layer, wherein a top surface of the silicon layer is farther above the n-type silicon carbide substrate than is a top surface of the silicon carbide n-well.

19. The high power p-channel silicon carbide IGBT of claim 17, wherein a top surface of the silicon layer is even with or below a top surface of the silicon carbide n-well.

20. A high power insulated gate bipolar junction transistor ("IGBT") that includes a silicon carbide bipolar junction transistor ("BJT") and a MOSFET, the IGBT comprising:

a plurality of silicon carbide layers that include first and second silicon carbide well regions; and a doped semiconductor layer that forms a p-n heterojunction with a first of the plurality of silicon carbide layers, the doped semiconductor layer disposed between the first and second silicon carbide well regions;

wherein the silicon carbide BJT is located within the plurality of silicon carbide layers;

wherein a source region and a drain region of the MOSFET are located within the plurality of silicon carbide layers, and a gate electrode of the MOSFET is on the doped semiconductor layer; and wherein the doped semiconductor layer is configured to provide a minority carrier current path between the first and second well regions.

21. The high power IGBT of claim 20, wherein the doped semiconductor layer comprises a doped silicon layer.

22. The high power IGBT of claim 21, wherein the doped silicon layer comprises a doped polysilicon minority carrier diverter.

23. The high power IGBT of claim 22, wherein a top surface of the doped polysilicon layer is farther above an n-type substrate of the IGBT than is a top surface of a collector region of the BJT.

24. The high power IGBT of claim 22, wherein a top surface of the doped polysilicon layer is even with or below a top surface of the collector region of the BJT.

25. The high power IGBT of claim 20, wherein the doped semiconductor layer is between a base of the BJT and the gate electrode of the MOSFET.

* * * * *

UNITED STATES PATENT AND TRADEMARK OFFICE
CERTIFICATE OF CORRECTION

PATENT NO.           : 8,629,509 B2
APPLICATION NO.      : 12/556870
DATED                : January 14, 2014
INVENTOR(S)          : Ryu et al.

It is certified that error appears in the above-identified patent and that said Letters Patent is hereby corrected as shown below:

On Title Page:
Page 4, Other Publications, right column, line 28:
  Correct "Hubei, K," to read -- Hubel, K, --

In the Specification:
Column 8, Line 66: Correct "act (as the collectors"
                to read -- act as the collectors --

In the Claims:
Column 15, Claim 1, Lines 5-6:
  Correct "MOSFET configured to divert"
  to read -- MOSFET that is configured to divert --

Signed and Sealed this
Thirtieth Day of September, 2014

Michelle K. Lee
*Deputy Director of the United States Patent and Trademark Office*